(12) United States Patent
Goldin et al.

(10) Patent No.: US 11,064,604 B1
(45) Date of Patent: Jul. 13, 2021

(54) FLEXIBLE CIRCUIT BOARD FOR A CONFORMAL WEARABLE BATTERY

(71) Applicant: Inventus Power, Inc., Woodridge, IL (US)

(72) Inventors: Elijah Brett Goldin, Chicago, IL (US); Anvin Joe Manadan, Woodridge, IL (US)

(73) Assignee: Inventus Power, Inc., Woodridge, IL (US)

( * ) Notice: Subject to any disclaimer, the term of this patent is extended or adjusted under 35 U.S.C. 154(b) by 0 days.

(21) Appl. No.: 17/038,287

(22) Filed: Sep. 30, 2020

(51) Int. Cl.
| | |
|---|---|
| *H05K 1/00* | (2006.01) |
| *H05K 1/02* | (2006.01) |
| *H05K 1/18* | (2006.01) |
| *H01M 10/42* | (2006.01) |

(52) U.S. Cl.
CPC ........ *H05K 1/028* (2013.01); *H01M 10/4257* (2013.01); *H05K 1/181* (2013.01); *H05K 1/189* (2013.01); *H01M 2220/30* (2013.01); *H05K 2201/09063* (2013.01); *H05K 2201/10037* (2013.01)

(58) Field of Classification Search
CPC ........ H05K 1/028; H05K 1/189; H05K 1/181; H05K 2201/09063; H05K 2201/10037; H01M 10/4257; H01M 2220/30
USPC ........................................................ 174/254
See application file for complete search history.

(56) References Cited

U.S. PATENT DOCUMENTS

| | | | |
|---|---|---|---|
| 3,993,507 A | 11/1976 | Hardigg | |
| 4,053,685 A | 10/1977 | Rowley et al. | |
| 4,346,151 A | 8/1982 | Uba et al. | |

(Continued)

FOREIGN PATENT DOCUMENTS

| | | |
|---|---|---|
| CN | 201922162396 | 7/2020 |
| KR | 20080056978 A | 6/2008 |

(Continued)

OTHER PUBLICATIONS

Rogers Corporation, "PORON® ShockSeal™ 4790-79 Foams," visited on Nov. 2, 2020 at <https://rogerscorp.com/Elastomeric%20Material%20Solutions/PORON%20Industrial%20Polyurethanes/PORON%20ShockSeal%204790%2079%20Foams>, 3 pp.

(Continued)

*Primary Examiner* — Anatoly Vortman
*Assistant Examiner* — Zhengfu J Feng
(74) *Attorney, Agent, or Firm* — Banner & Witcoff, Ltd.

(57) ABSTRACT

A flexible printed circuit board assembly (PCBA) for a conformal wearable battery (CBB) includes attachment sections for a plurality of battery cells that are arranged in a grid-like pattern on a same side of the flexible PCBA. The flexible PCBA is configured to fold along a bend axis so that the flexible PCBA is folded approximately in half. To reduce mechanical stresses placed on the flexible PCBA when folding the flexible PCBA along the bend axis, the flexible PCBA includes a plurality of cut-outs dispersed along the bend axis and parallel to adjacent battery cells. The CWB is configured to flex during use. The flexible PCBA includes a plurality of cut-outs disposed perpendicular to the bend axis, between adjacent rows of battery cells, and on the bend axis to relieve mechanical stresses applied to a bent portion of the flexible PCBA when the CWB is flexed during use.

20 Claims, 22 Drawing Sheets

(56) References Cited

U.S. PATENT DOCUMENTS

| | | | |
|---|---|---|---|
| 4,658,498 A | 4/1987 | Yamaura et al. | |
| 6,376,126 B1 | 4/2002 | Faust et al. | |
| 6,410,184 B1 | 6/2002 | Horiuchi et al. | |
| 6,528,204 B1 | 3/2003 | Hikmet et al. | |
| 6,773,848 B1 | 8/2004 | Nortoft et al. | |
| 8,192,863 B2 | 6/2012 | Best et al. | |
| 8,795,880 B2 | 8/2014 | Matsubara | |
| 8,860,372 B2 | 10/2014 | Guang et al. | |
| 8,927,137 B2 | 1/2015 | Ayub et al. | |
| 9,564,761 B2 | 2/2017 | Hopfer, III et al. | |
| 9,640,831 B2 | 5/2017 | Tajima et al. | |
| 9,660,225 B2 | 5/2017 | Miyake | |
| 9,755,279 B2 | 9/2017 | Moon | |
| 9,756,733 B2 | 9/2017 | Drzaic et al. | |
| 9,780,421 B2 | 10/2017 | Palanchon et al. | |
| 9,843,073 B2 | 12/2017 | Yoneda et al. | |
| 9,941,506 B2 | 4/2018 | Hiroki et al. | |
| 10,056,584 B2 | 8/2018 | Hwang | |
| 10,134,528 B2 | 11/2018 | Stockman | |
| 10,224,517 B2 | 3/2019 | Kimura | |
| 10,236,492 B2 | 3/2019 | Miyake | |
| 10,320,025 B2 | 6/2019 | Hiroki et al. | |
| 10,388,939 B2 | 8/2019 | Urano et al. | |
| 10,686,167 B2 | 6/2020 | Goto et al. | |
| 2002/0017700 A1 | 2/2002 | Mori et al. | |
| 2002/0127362 A1 | 9/2002 | Jansen et al. | |
| 2006/0210841 A1 | 9/2006 | Wallace et al. | |
| 2008/0241677 A1 | 10/2008 | Garcia Alberola | |
| 2008/0241680 A1 | 10/2008 | Lee et al. | |
| 2009/0291361 A1 | 11/2009 | Scorziello | |
| 2013/0295434 A1* | 11/2013 | Ayub | H01M 50/209 |
| | | | 429/157 |
| 2014/0212695 A1 | 7/2014 | Lane et al. | |
| 2015/0044511 A1 | 2/2015 | Kim et al. | |
| 2015/0194697 A1 | 7/2015 | Hung et al. | |
| 2015/0311495 A1 | 10/2015 | Wang | |
| 2016/0156012 A1 | 6/2016 | Takahashi et al. | |
| 2016/0218387 A1 | 7/2016 | Tajima | |
| 2016/0233695 A1 | 8/2016 | Hopfer, III et al. | |
| 2017/0018784 A1 | 1/2017 | Yun et al. | |
| 2017/0025669 A1 | 1/2017 | Urano et al. | |
| 2017/0079139 A1 | 3/2017 | Wu | |
| 2018/0062197 A1 | 3/2018 | Thiel et al. | |
| 2018/0083233 A1 | 3/2018 | Young et al. | |
| 2018/0175346 A1 | 6/2018 | Schmid-Schoenbein | |
| 2018/0261900 A1 | 9/2018 | Kim et al. | |
| 2018/0301741 A1 | 10/2018 | Kumar et al. | |
| 2019/0088979 A1 | 3/2019 | Grady et al. | |
| 2019/0090350 A1* | 3/2019 | Kumar | H05K 3/4644 |
| 2019/0237832 A1 | 8/2019 | Ju et al. | |
| 2019/0305303 A1 | 10/2019 | Yebka et al. | |
| 2019/0326647 A1 | 10/2019 | Kawai et al. | |
| 2020/0127259 A1 | 4/2020 | Yoshida et al. | |
| 2020/0243808 A1 | 7/2020 | Harutyunyan et al. | |
| 2020/0245495 A1 | 7/2020 | Yi et al. | |
| 2020/0403566 A1* | 12/2020 | Yamaai | H02S 40/36 |

FOREIGN PATENT DOCUMENTS

| | | |
|---|---|---|
| WO | 08023199 A1 | 2/2008 |
| WO | 17209052 A1 | 12/2017 |

OTHER PUBLICATIONS

Inventus Power, "Conformal Wearable Batteries Safe, 'Flexible, Wearable Power Designed to Increase Mission Effectiveness'," visited at <https://inventuspower.com/conformal-wearable-batteries/> on Nov. 4, 2020, pp. 3.

Rebecca Cragun, et al., "Li-Ion Conformal Wearable Battery," EaglePicher Technologies, LLC visited at <http://www.powersourcesconference.com/Power%20Sources%202018%20Digest/docs/34-2.pdf> on Feb. 9, 2020, pp. 577-580.

Eaglepicher Technologies, "Rechargeable Conformal Battery", visited at <https://www.eaglepicher.com/sites/default/files/SLB-101%20061419.pdf> on Feb. 9, 2020, pp. 2.

* cited by examiner

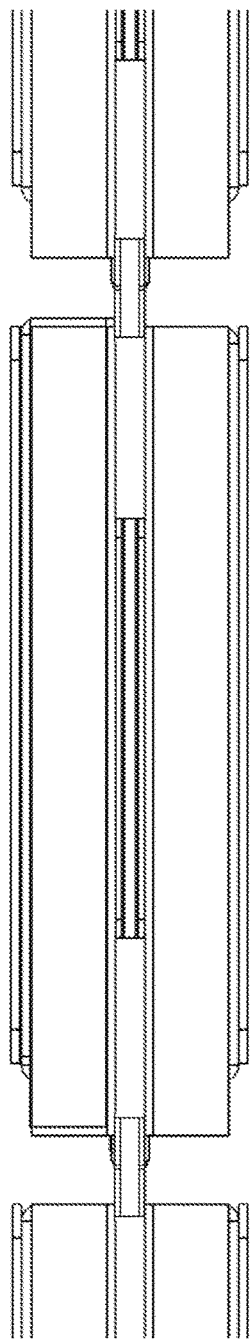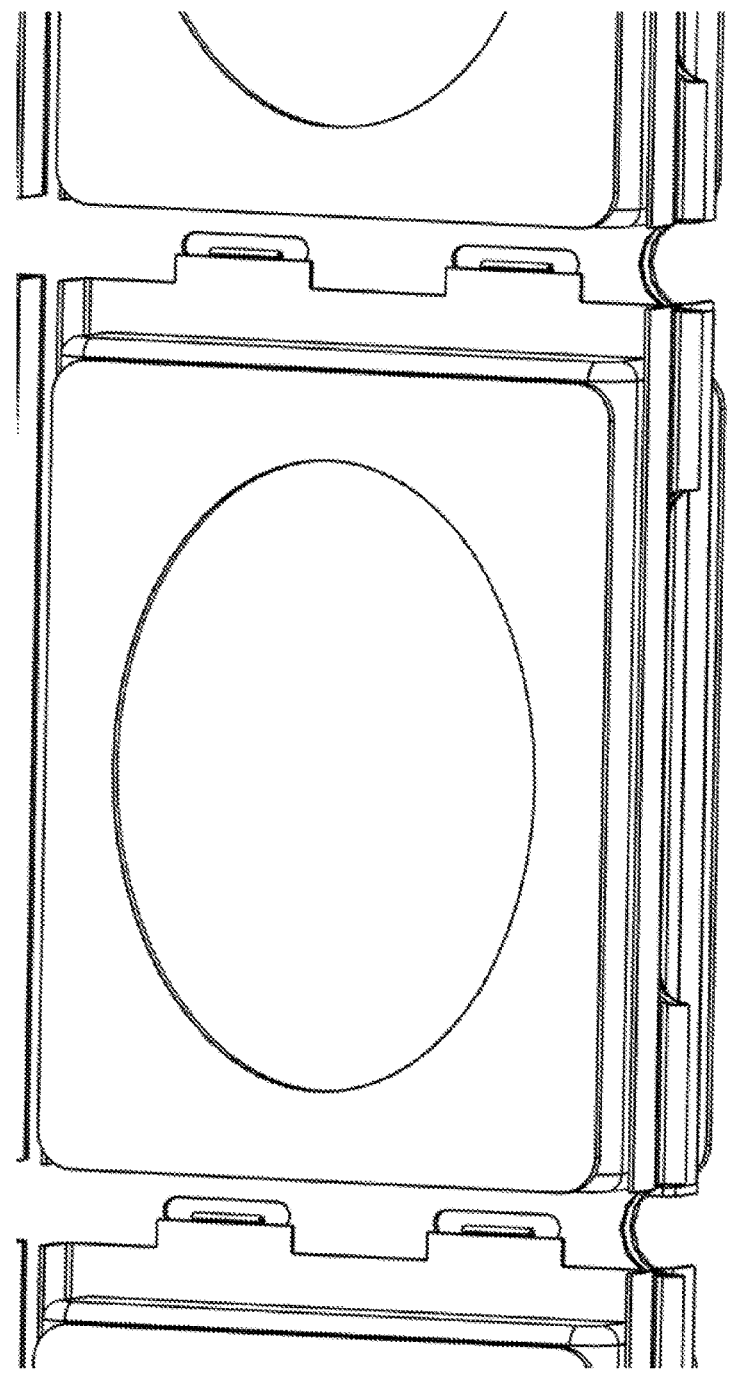
FIG. 15
FIG. 16

US 11,064,604 B1

FLEXIBLE CIRCUIT BOARD FOR A CONFORMAL WEARABLE BATTERY

FIELD

Aspects described herein generally relate to portable electrical power storage systems. More specifically, aspects of this disclosure relate to a flexible printed circuit boards providing conductive paths for a matrix of battery cells.

BACKGROUND

Portable battery systems may be utilized to provide mobile and/or remote location electrical power. Integrated communications equipment and/or weapons gear utilized, for example, by law enforcement and/or military personnel requires increasingly high levels of power storage carried proximate the user's body. Methods of increasing power storage capability in a device, such as a conformal wearable battery (CWB) is to include additional battery cells and/or use higher capacity battery cells. However, these solutions may unacceptably increase the size and/or weight of the resulting systems, reducing mobility.

In addition, batteries may come in different shapes and sizes depending on their intended usage. Some batteries may be arranged as packages of battery cells that are assembled together to provide a predetermined power output. These battery packages may be arranged in a durable and sealed housing to protect the batteries from damage. In some instances, the battery packages may be desired to flex or bend to accommodate their intended usage.

As such, a need has been recognized within the mobile electrical power storage industry for increasing power capacity while improving an overall user safety of these systems while simultaneously reducing their size and weight.

SUMMARY

Aspects of the disclosure provide solutions that address and overcome technical problems associated with minimizing size of a portable battery system (e.g. a conformal wearable battery system).

A flexible printed circuit board assembly (PCBA) for a conformal wearable battery (CBB) includes attachment sections for a plurality of battery cells that are arranged in a grid-like pattern on a same side of the flexible PCBA. The flexible PCBA is configured to fold along a bend axis so that the flexible PCBA is folded approximately in half. To reduce mechanical stresses placed on the flexible PCBA when folding the flexible PCBA along the bend axis, the flexible PCBA includes a plurality of cut-outs dispersed along the bend axis and parallel to adjacent battery cells. The CWB is configured to flex during use. The flexible PCBA includes a plurality of cut-outs disposed perpendicular to the bend axis, between adjacent rows of battery cells, and on the bend axis to relieve mechanical stresses applied to a bent portion of the flexible PCBA when the CWB is flexed during use.

Aspects of the disclosure may relate to a conformal wearable battery that may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

Aspects of the disclosure may relate to a conformal wearable battery that may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

Aspects of the disclosure may relate to a conformal wearable battery that may include a bend axis where the bend axis comprises a center portion of the grid like pattern of the physical connection sections.

Aspects of the disclosure may relate to a conformal wearable battery that may include the plurality of cut-outs where each first cut-out of the plurality of first cut-outs is rectangular-shaped, and where a longer edge of each first cut-out is disposed parallel to the bend axis. The conformal wearable battery may include a first cut-out where each corner of each first cut-out of the plurality of first cut-outs is rounded and/or where each second cut-out of the plurality of second cut-outs comprises a first semi-circular section, a second semi-circular section and a rectangular section. The flexible PCBA may include a first cut-out where the rectangular section is disposed between the first semi-circular section and the second semi-circular section and/or where the rectangular section is disposed laterally across the bend axis, wherein a mid-point of the rectangular section is located near the bend axis.

Aspects of the disclosure may relate to a conformal wearable battery that may have each of the plurality of battery cells physically attached to a first side of the flexible PCBA and/or where the plurality of battery cells is disposed on an outside surface of the flexible PCBA when the flexible PCBA is in a folded configuration.

Aspects of the disclosure may relate to a conformal wearable battery that may further include a sealed flexible housing wherein the flexible PCBA is disposed within an interior cavity of the sealed flexible housing and wherein the flexible PCBA is in a folded configuration.

Aspects of the disclosure may relate to a system that may include a plurality of battery cell modules and a flexible printed circuit board assembly (PCBA). The flexible PCBA includes a plurality of battery cell connection sections disposed in a grid-like pattern along a first surface of the flexible PCBA, a bend axis configured to divide the flexible PCBA in half when the flexible PCBA is in a folded configuration, and a plurality of cut-outs disposed along the bend axis, wherein each of the plurality of cut-outs reduce a bending force placed on the flexible PCBA when a flexing force is applied to the flexible PCBA. The system may include the plurality of cut-outs comprises a plurality of first cut-outs having a first shape, and a second plurality of cut-outs having a second shape. In some cases, the first shape comprises a substantially rectangular shape having rounded corners and/or the second shape comprises at least one semi-circular section and a rectangular section. In some cases, the second shape comprises a rectangular section disposed across the bend axis and a first semi-circular section disposed at an end of the rectangular section on a first side of the bend axis and a second semi-circular section disposed at an opposite end of the rectangular section and on an opposite side of the bend axis. In some cases, a first plurality of cut-outs of the plurality of cut-outs are located near an approximate mid-point of a battery cell module and/or where a portion of the plurality of cut-outs is disposed on a bend line that is perpendicular to the bend axis and between two adjacent battery cell modules Aspects of the disclosure may relate to a flexible printed circuit board assembly (PCBA) that may include a plurality of battery modules physically affixed to the flexible PCBA, wherein the plurality of battery modules are arranged in a grid-like pattern, a bend axis near an approximate mid-point of the flexible PCBA, wherein bending the flexible PCBA along the bend axis folds the flexible PCBA in half, and a plurality of cut-outs disposed along the bend axis, wherein the cutouts reduce a force exerted on the flexible PCBA along the bend axis when the flexible circuit board is flexed. In some cases, the plurality of cut-outs disposed along the bend axis comprise a plurality of first cut-outs having a first shape and a plurality of second cut-outs having a second shape and wherein the plurality of first cut-outs are disposed along a flexible portion of the flexible PCBA between adjacent rows of the grid-like pattern that are perpendicular to the bend axis and the plurality of second cut-outs are disposed between adjacent battery modules in columns of the grid-like pattern, wherein the columns are on opposite sides of the bend axis.

BRIEF DESCRIPTION OF THE DRAWINGS

The present disclosure is illustrated by way of example and not limited in the accompanying figures in which like reference numerals indicate similar elements and in which:

FIG. 15 shows a partial side view of the flexible printed circuit board assembly after folding along the center line according to aspects of the disclosure;

FIG. 16 shows a partial first view of the flexible printed circuit board assembly after folding along the center line according to aspects of the disclosure;

DETAILED DESCRIPTION

Figure 1:
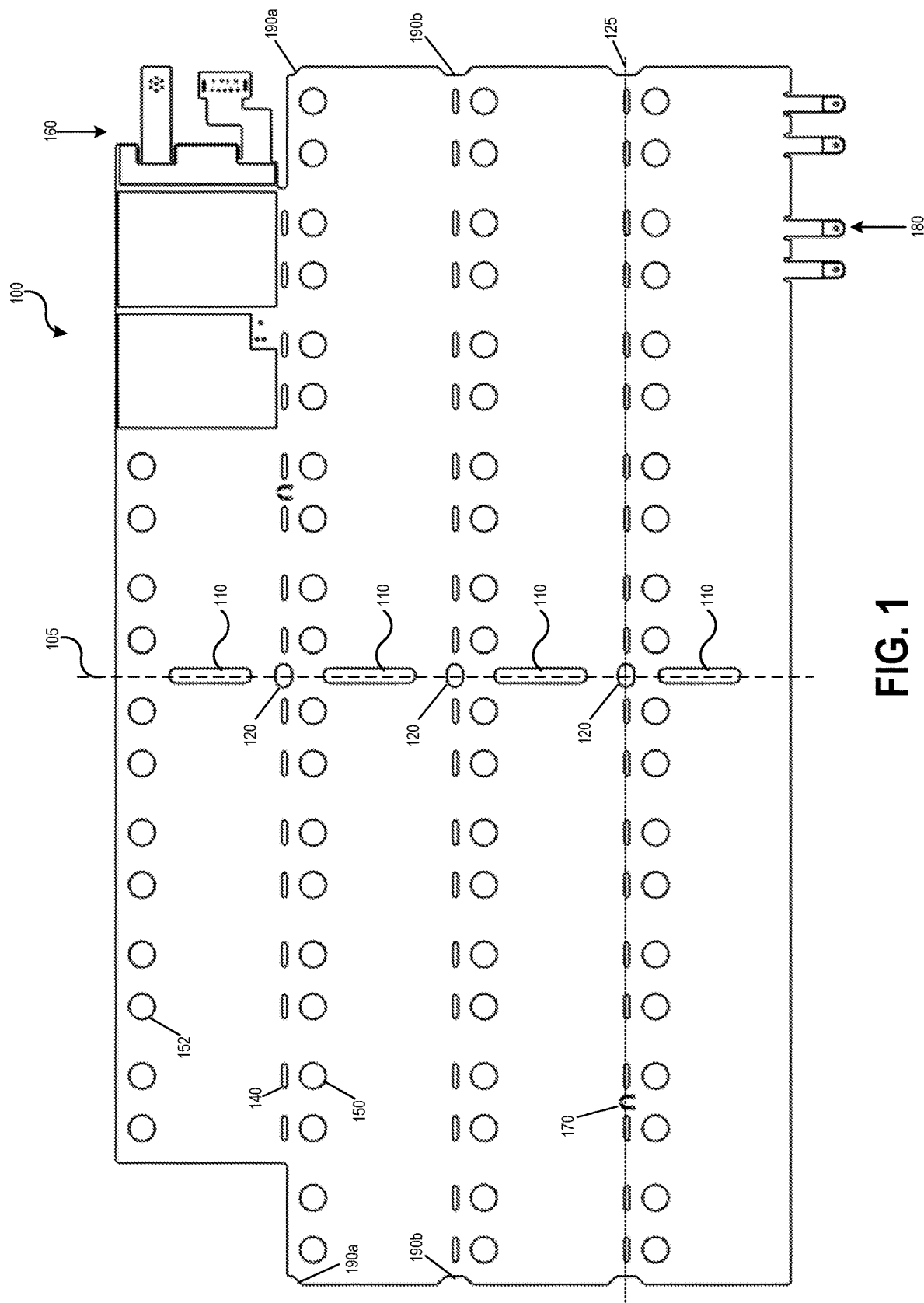
FIG. 1 shows a first view of an illustrative flexible printed circuit board for an illustrative conformal wearable battery system according to aspects of the present disclosure.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure.

It is noted that various connections between elements are discussed in the following description. It is noted that these connections are general and, unless specified otherwise, may be direct or indirect, and that the specification is not intended to be limiting in this respect.

A rechargeable conformable wearable battery (CWB) assembly may be worn by a user to power electronic devices that the user carries. The CWB assembly may be subjected to environmental conditions that the user is also subjected to. A sealed housing and a reliable seal may facilitate longer battery life and utility for the user regardless of environmental conditions that the CWB may be subjected to. To provide a desired power output, the CWB assembly may include a plurality of battery cells, each with a rated power capacity and when electrically connected, may allow the CWB to provide a desired power output.

A CWB assembly may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB assembly. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

The battery cell housing may be formed of a molded casing. The molded casing may be a sealed case that is formed by a molding process, for example, an injection molding process. The molded casing may be formed of a plastic material, for example. The casing may be sealed to prevent ingress of solid material and/or liquid material, for example, according to an IP67 rating, IP68 rating, or other ingress protection rating. The casing may feature a seam between two halves of the casing that is sealed to encase the battery cell within the casing. The positive-charge terminal and the negative-charge terminal may each include a conductive region that passes between the interior of the cell housing and the exterior of the cell housing at a seam of the casing. The conductive region may be affixed and electrically connected to the battery cell in an interior of the cell housing at one end, pass through the sealed seam of the casing, and affix to a contact component that electrically couples with electrical devices at an exterior of the cell housing.

Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

The battery cell housing may be formed of a molded casing. The molded casing may be a sealed case that is formed by a molding process, for example, an injection molding process. The molded casing may be formed of a plastic material, for example. The casing may be sealed to prevent ingress of solid material and/or liquid material, for example, according to an IP67 rating, IP68 rating, or other ingress protection rating. The casing may feature a seam between two halves or portions of the casing that is sealed to encase the battery cell within the casing.

The positive-charge terminal and the negative-charge terminal may each include a conductive region that passes between the interior of the cell housing and the exterior of the cell housing at an outer wall of the casing. The conductive region may be affixed and electrically connected to the battery cell in an interior of the cell housing at one end, pass through the sealed wall of the casing, and affix to a contact component that electrically couples with electrical devices at an exterior of the cell housing.

In some cases, the CWB assembly may be provided in a form factor easily carried by a person, such as within a pocket or with other means of securing the CWB assembly to a person's clothing, uniform, or the like. To provide the specified power output, while also providing flexibility for conforming to a shape of person's body or equipment when carried, the matrix of battery cells may be arranged on, and affixed to, a flexible printed circuit board. To fit within the housing of the CWB assembly, the flexible printed circuit board assembly may be configured to be folded along an axis (e.g., a center line), such that battery cell modules may be on an exterior surface of the flexible printed circuit board assembly closest to the housing, while the electrical connections may be made on an interior surface of the folded printed circuit board assembly. An electrical insulator (e.g., foam, insulating tape, etc.) may be placed between the folded sections to provide electrical insulation for the electrical contacts.

FIG. 1 shows a first view of an illustrative flexible printed circuit board (PCB) 100 for an illustrative conformal wearable battery system according to aspects of the present disclosure. The flexible PCB may be configured to provide power and/or electrical signals from a plurality of battery cells and/or other components of a CWB. The flexible PCB 100 may be formed of one or more layers of a flexible polymer or plastic material, such as a polyimide or other such flexible substrate. In some cases, markings showing locations of placement of battery cells may be formed through a silk-screening process, or other like method. In some cases, markings may not be present on a surface of the flexible PCBA. Electrical conductors may be included in one or more layers of the flexible PCBA. In some cases, electrical conductors may be configured as a conductive pattern (e.g., a copper overlay, a conductive ink, etc.) on the surface of the substrate of the flexible PCB 100. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties.

The flexible PCB 100 may be configured to bend along a bend line 105 located at or near a center line of the flexible PCB 100. One or more elongated cut-outs may be disposed parallel to the bend line 105 (e.g., cut-out 110) and/or perpendicular to the bend line 105 (e.g., cut-out 120), where the cut-outs perpendicular to the bend line 105 may be aligned with a flex line 125 perpendicular to the bend line 105. In some cases, the flex line may correspond to a section of the flexible PCB 100 located between rows of components (e.g., battery cells) along which the CWB may bend during use. Such cut-outs may provide additional flexibility to the flexible PCB 100 to allow for easier formation of a 180-degree bend such as by folding the right half of the flexible PCB 100 over the left half of the flexible PCB 100. In the illustrative example, relief cuts, such as the cut-out 110 may be formed as a rounded elongated rectangular cutout and the cut-out 120, may be formed in a generally obround shape (e.g., two substantially semi-circular sections connected by a rectangular section). As mentioned, the elongated rounded rectangular cut-outs (e.g., cut-out 110) parallel to the bend line 105 may reduce stress on the plastic substrate when forming the about 180-degree bend. Additionally, the obround-shaped cut-outs (e.g., cut-out 120) may reduce stresses placed on the flexible PCB substrate during use, such as by reducing stresses along a line of deformation (e.g., the flex line 125) between battery cells. In some cases, additional cut-outs may be included to reduce stresses along the flex line, such as at an edge of the flexible PCB 100, such as a corner notch 190a located near a corner formed in the edge of the flexible PCB 100 near a flex line and/or a notch 190b located along an edge of the flexible PCB 100 and aligned near a flex line. By reducing the bending stress at locations along the bend line, a probability of a catastrophic failure of the substrate (e.g., cracking, delamination, and the like) is reduced. While cut-out 110 is shown as a rounded rectangular shape and the cut-out 120 is shown as an obround shape, other shapes may be used to reduce stress due to bending and/or flexing of the flexible PCB 100. While an obround shape is shown on the illustrative example, other cut shapes may be used to achieve a same or similar purpose. Such other shapes may include circular cuts which may be used, for example, for removing more weight, oval cuts which may provide additional stress relief, for example, based on the curves, elongated slots which, for example, may be similar to the rectangular cuts but with even more filet on corners to reduce additional stresses, a dog-bone shape (e.g., two substantially circular sections connected by a rectangular section, or the like.

The flexible PCB 100 may also include a plurality of solder pads (e.g., pads 150) to provide electrical connection for the cathode and anode of each battery module. For battery cells located near an edge of the flexible PCB 100, the cathode an anode connectors may be bent over the edge of the flexible PCB 100. For battery cells located away from the edge of the flexible PCB, a plurality of cut-outs (e.g., cut-out 140) are located near a corresponding pad 150 to allow for solder or weld connection of the battery cathode or anode connector to the flexible PCB 100. Additionally, the flexible PCB 100 may include charging connection portion 190 that may be used to connect to one or more charging tabs on an exterior portion of a case of the conformal wearable battery enclosure and/or a flexible connector portion 160 that may include one or more flexible connectors to connect to additional circuitry, such as a control module, a display module, or the like). The flexible PCB 100 may also include one or more semi-circular cut-out sections 180 to provide an area of low mechanical stress at an interior portion of the flexible PCB 100. In some cases, an electrical component 280, shown in FIG. 2, (e.g., a thermistor) may be physically connected to the flexible PCB 100 in this area such that the electrical component does not receive stress loads while the CWB is flexed during use. Such stress loads, without the stress relief provided by the semi-circular cut-outs, may cause the electrical component to detach from the flexible PCB 100.

Figure 2:
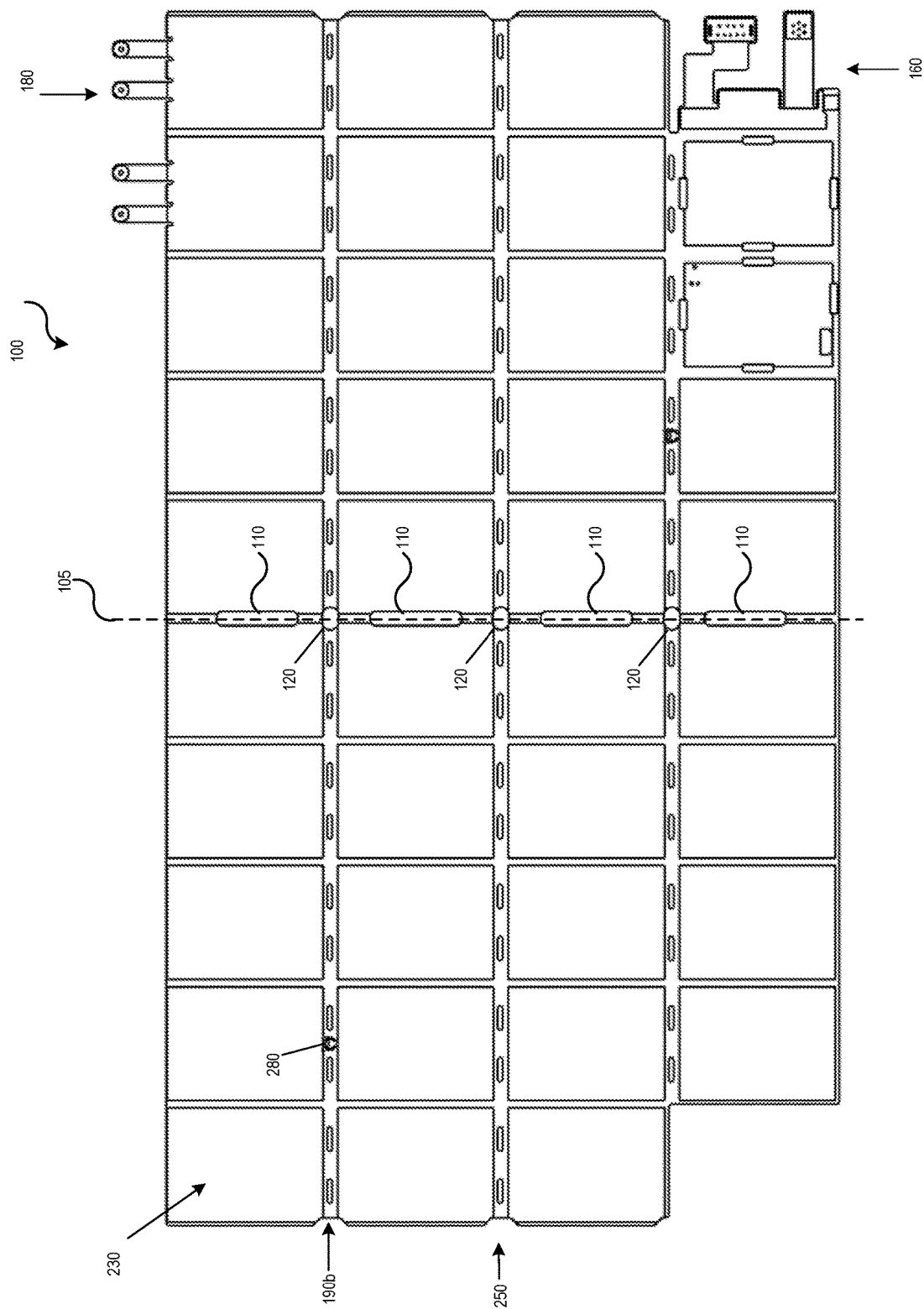
FIG. 2 shows a second view of the illustrative flexible printed circuit board for the illustrative conformal wearable battery system according to aspects of the present disclosure.

FIG. 2 shows second view of the illustrative flexible printed circuit board 100 for the illustrative conformal wearable battery system according to aspects of the present disclosure. In some cases, connection locations for each battery cell may be marked. Additionally or alternatively battery cell connection locations may include a rigidizing material, or may be otherwise reinforced. Each battery cell location 230 may be associated with a pair of cut-outs for the anode and cathode connections, as discussed above. Here, a battery cell module may be physically attached to the substrate of the flexible PCB 100, such as by use of an adhesive material (e.g., glue, tape, etc.). The cathode and anode connection tabs may be inserted through a corresponding cut-out 140 so that the connection tabs may be soldered, laser welded, or otherwise connected to the connection pad 150 on the other side of the flexible PCB 100.

The electrical connection cut-outs (e.g., cut-out 140) and/or end cut-outs (e.g., cut-out 190a, 190b) may be disposed near or offset from a flex line 250 between rows of battery cell locations 230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 250 allow for the CWB to be flexed within a designed range of motion, when in use. To provide stress relief along these flex lines between the rigid battery cell portions, the obround-shaped cut-outs 120 are disposed within each flex line 250 and may be aligned with a portion of the battery cell connection cut-outs (e.g., cut-out 140) and the edge cut-outs 190a, 190b may be aligned to the flex lines 250 and located at an edge of the flexible PCB 100.

Figure 3:
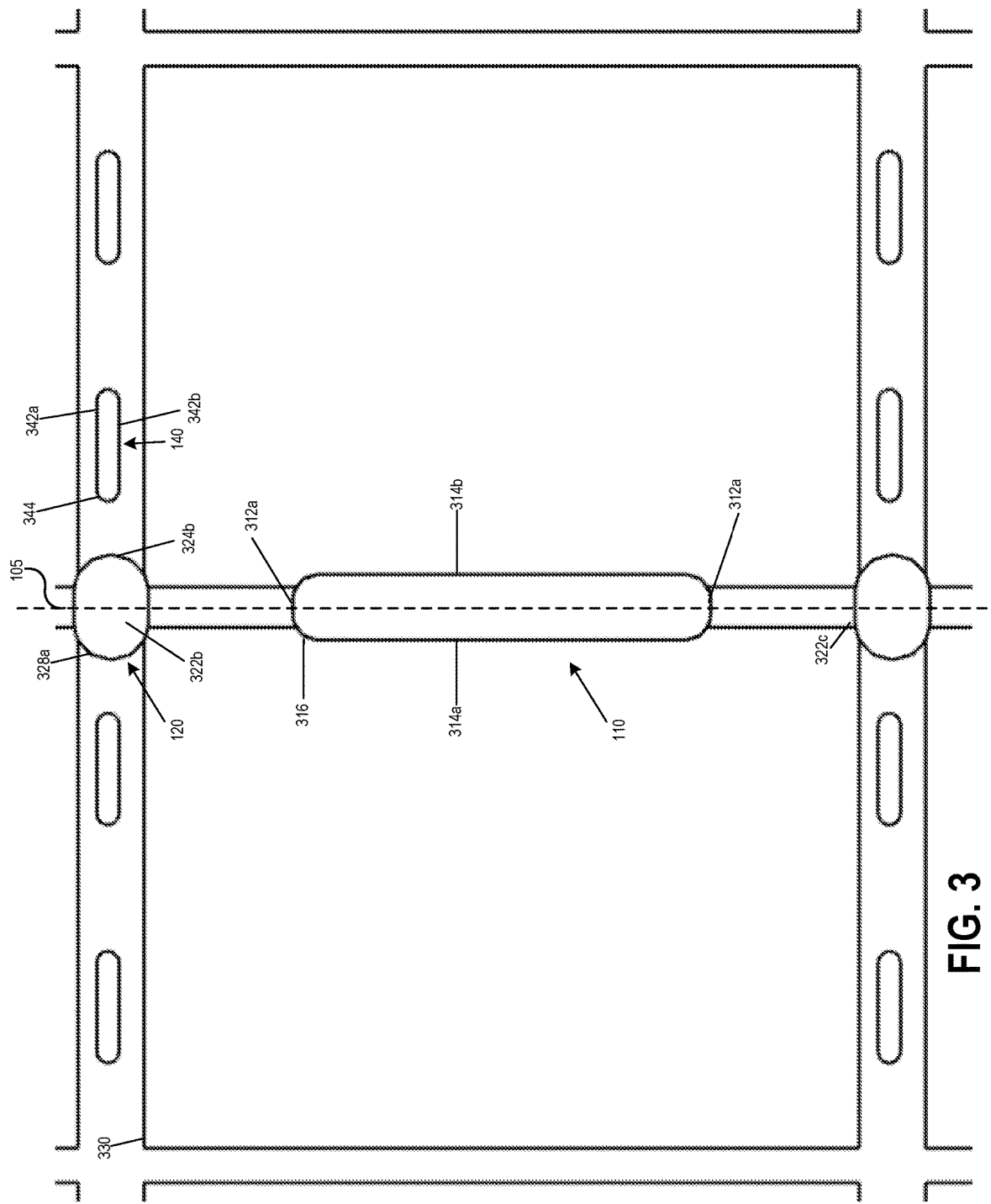
FIG. 3 shows a partial second view of the illustrative flexible printed circuit board including cut-outs providing strain relief along a center line according to aspects of the present disclosure.

FIG. 3 shows a partial second view of the illustrative flexible printed circuit board 100 including cut-outs providing strain relief along a center line and/or along a flex line perpendicular to the center line according to aspects of the present disclosure. As discussed above, the rectangular cut-out 110 may be disposed centered on and parallel to the bend line 105 at the center of the flexible PCB 100, where at least a portion of the cut-out 110 may be disposed underneath a battery cell module when installed. In an illustrative example, a battery cell connection area 330 may be about 50 mm in length, where the cut-out 110 may be located near a mid-point of the battery cell connection area 330. In an illustrative example, a first edge 312a of the cut-out 110 may be located at a first distance (e.g., about 11.5 mm, about 12 mm, etc.) from a first edge of the battery cell connection area 330, the second edge 312b of the cut-out 110 may be located at a second distance (e.g., about 11.5 mm about 10 mm) from the second edge of the battery cell connection area 330, and the length of the cut-out 110 between the first edge 312a and the second edge 312b may be a first dimension (e.g., about 25 mm, about 28 mm, or the like). In some cases, cut-outs of a similar type may have different sizes and/or relative locations. A width of the cut-out between the left edge 314a and the right edge 314b may be a second dimension (e.g., about 4.5 mm), and a radius of each rounded corner 316 may be a third dimension (e.g., about 1.1 mm). The specific distances and/or dimension are given for illustrative purposes and other distances and/or dimensions may be contemplated within the scope of this disclosure.

The illustrative obround-shaped cut-out 120 may be formed as a rectangular area 322b (e.g., a rectangular area of about 2.2 mm×about 5 mm) connecting two semi-circular areas 328a and 328b (e.g., semicircular areas having a diameter of about 5 mm). For example, the obround-shaped connector 120 may be centered on and perpendicular to the bend line 105. The rectangular area 322b may larger than the distance between adjacent battery cell connection areas. Each semi-circular area 238a and 328b may overlap at least a portion of adjacent battery connection areas.

The illustrative battery connection cut-out 140 may be formed as an elongated oval shape, such as an illustrative shape of about 1.5 mm high and having a distance of about 6 mm between a center point of each circular end portion (e.g., 344) and an overall length of about 9 mm. In some cases, a second edge 342 of the cut-out 140 may align with a center line through the obround shaped cut-out 120. Additionally, the obround-shaped cut-out 120 may be located a distance (e.g., about 4 mm) from the battery connection cut-out 140.

Figure 4:
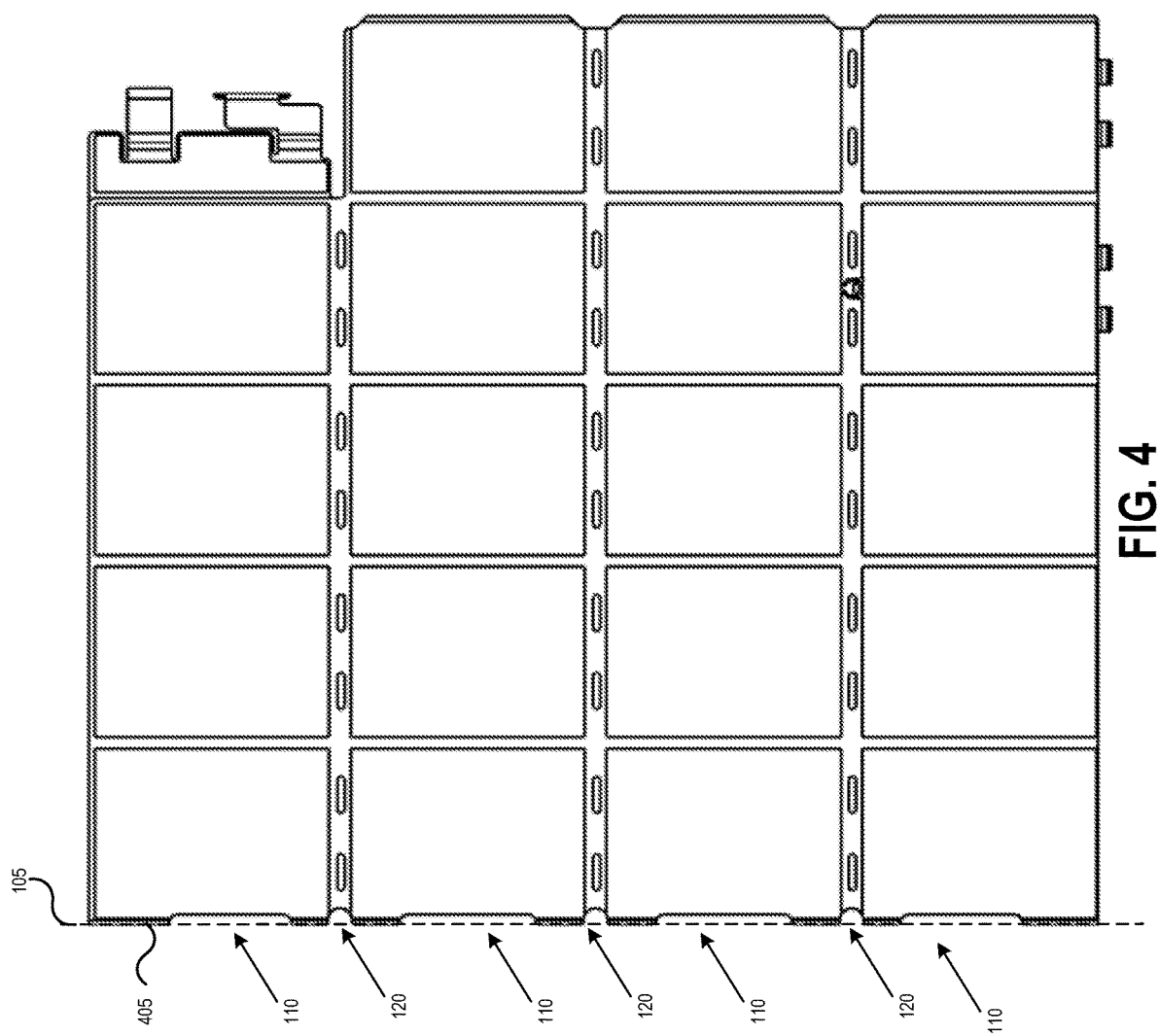
FIG. 4 shows a first view of the illustrative flexible printed circuit board folded along the center line according to aspects of the present disclosure.
Figure 5:
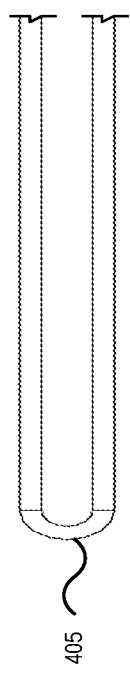
FIGS. 5 and 6 show a partial side view of the flexible printed circuit board when folded along the center line according to aspects of the present disclosure.
Figure 6:
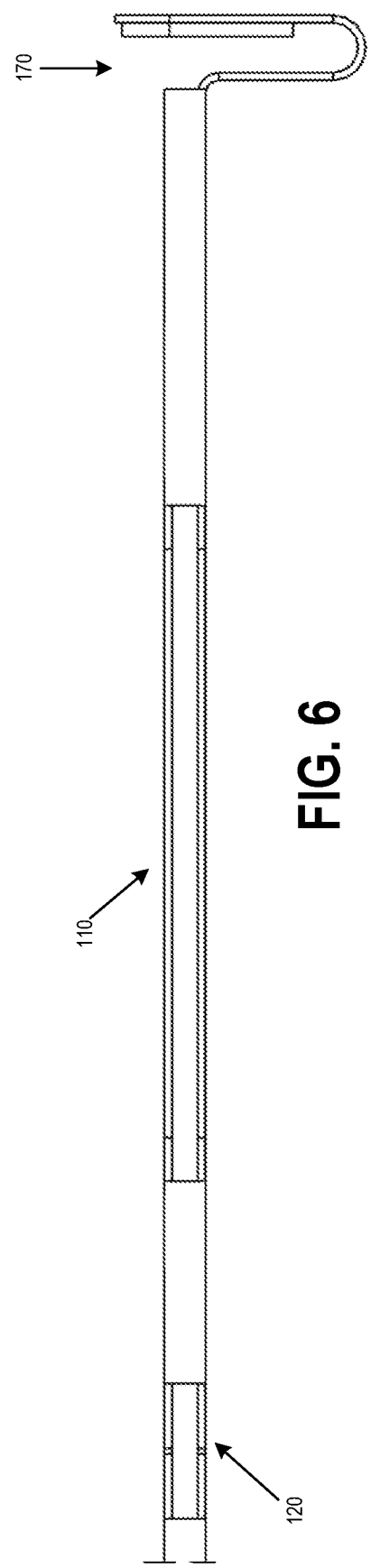
Figure 7:
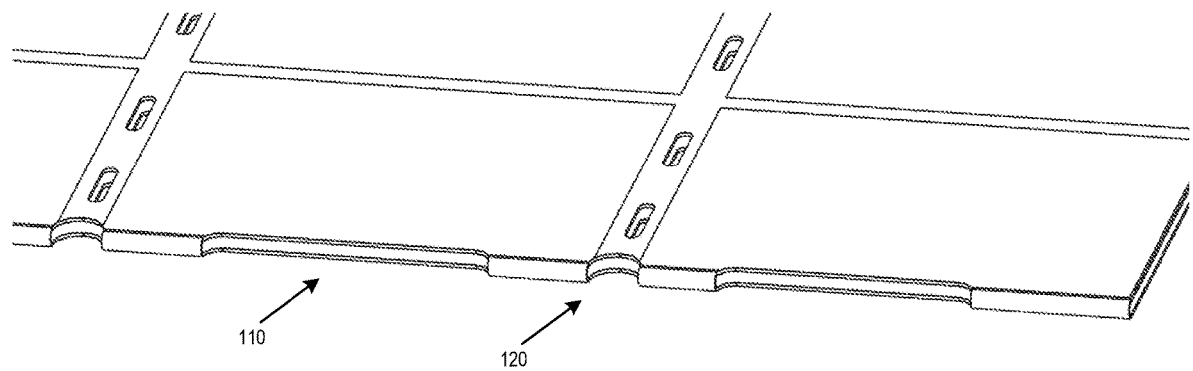
FIGS. 7 and 8 show partial views of the flexible printed circuit board when folded along the center line according to aspects of the present disclosure.
Figure 8:
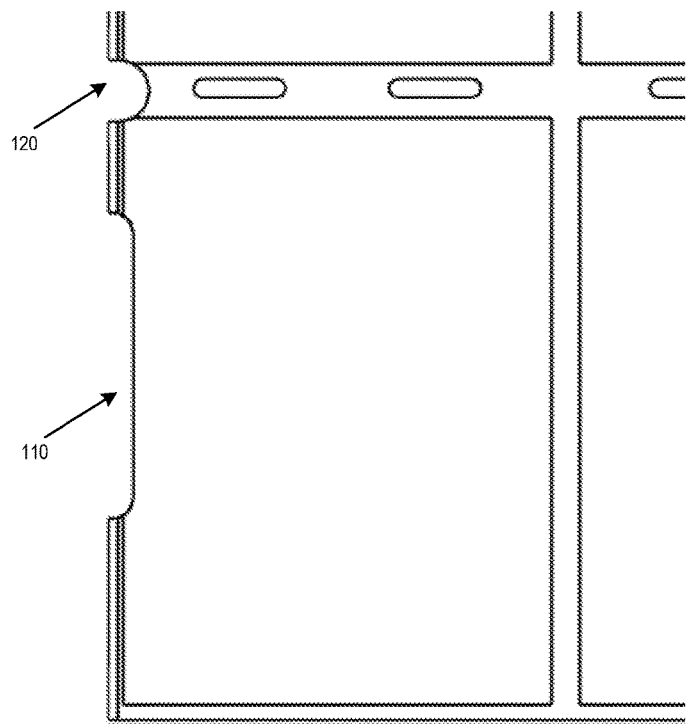

FIG. 4 shows a first view of the illustrative flexible printed circuit board 100 folded along the bend line 105 according to aspects of the present disclosure. For example, a 180-degree bend 405 may be formed along the bend line 105, such as when a left half of the flexible printed circuit board 100 is folded over a right half of the flexible printed circuit board 100 such that the battery modules are located on the exterior portion of the folded flexible printed circuit board 100 and the electrical connections for the battery modules are disposed on an interior portion of the folded flexible printed circuit board 100. FIGS. 5, 6, 7, and 8 show a partial side view of a magnified view of the flexible printed circuit board 100 when folded along the bend line 105 according to aspects of the present disclosure. As can be seen, a diameter of the bend 405 corresponds the length of the rectangular portion of the obround-shaped cut-out 120. In the illustrative example, the diameter of the bend 405 is about 2.25 mm.

Figure 9A:
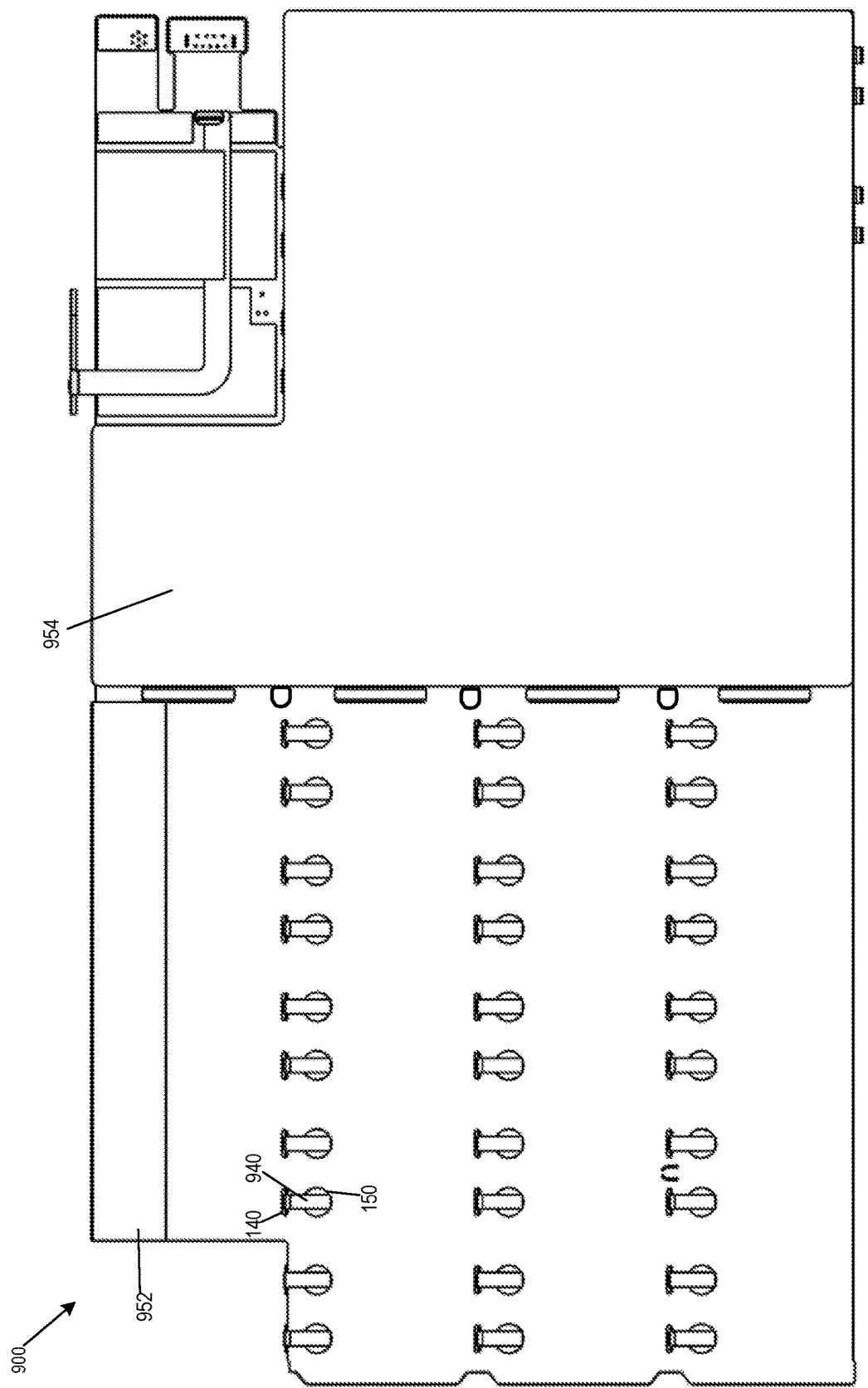
FIGS. 9A and 9B show first views of a flexible printed circuit board assembly before folding along the center line according to aspects of the present disclosure.
Figure 9B:
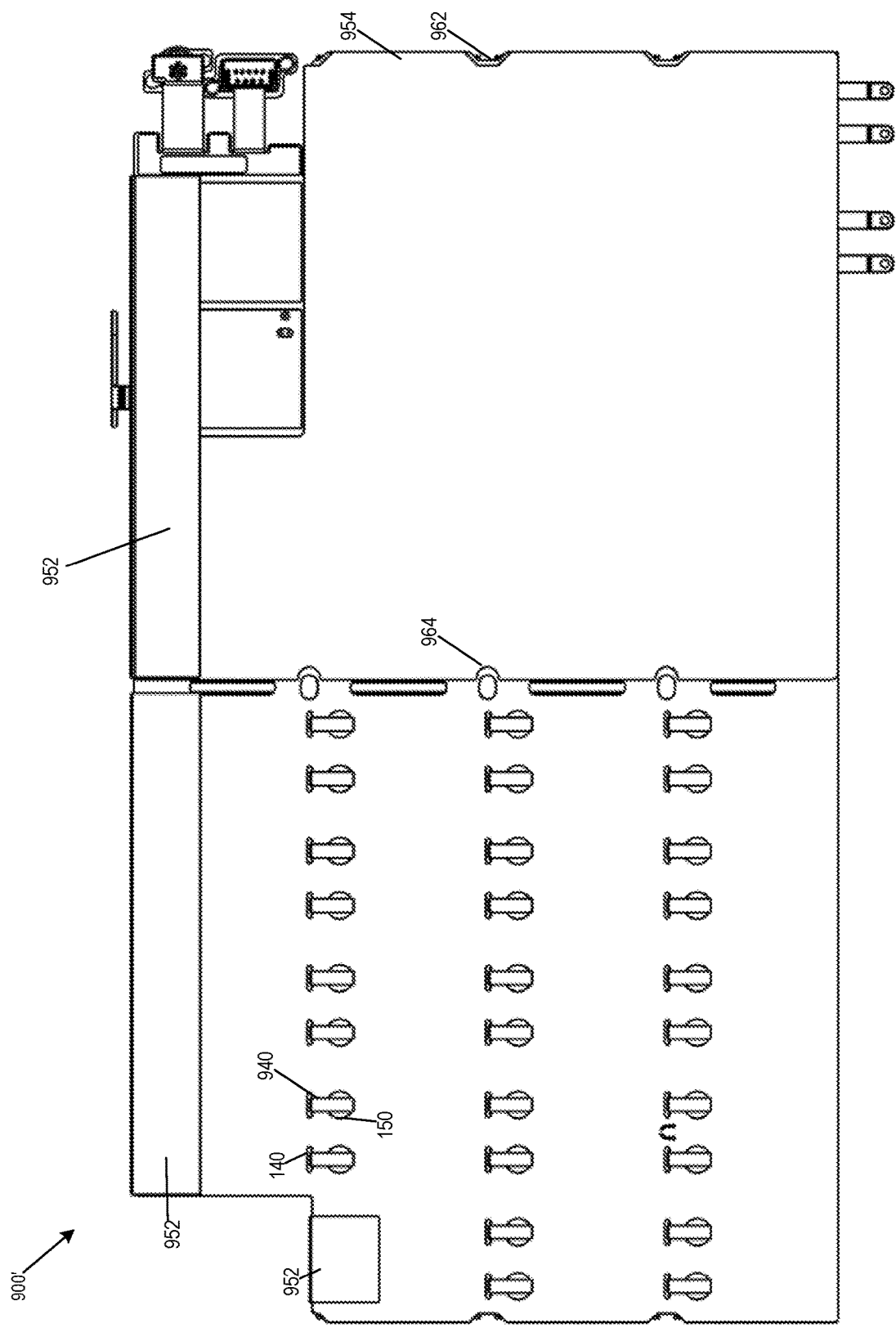

FIGS. 9A and 9B show first views of a flexible printed circuit board assembly (PCBA) 900 and 900' before folding along the bend line according to aspects of the present disclosure. As can be seen, cathode tabs and anode tabs extend from corresponding battery cell modules through a cut-out 140 so that each tab 940 may be soldered, welded, or otherwise connected to the electrical connection pad 150 forming an electrical connection for each battery cell. To protect against short circuits and/or to provide additional protection and/or structural integrity for the CWB, while maintaining flexibility, an insulating material 954 (e.g., a polymeric material, a foam, etc.), may be placed over a first half of the flexible PCBA 900 before folding and/or a second insulating material 952 may be placed over one or more of the tabs 940 that may be bent around an edge of the flexible PCBA 900. In some cases, the first insulating material 954 may include a plurality of cut-outs (e.g., cut-out 964, cut-out 962) that may align with similar cut-outs on the flexible PCBA 900' (e.g., cut-out 190a, cut-out 190b, cut-out 120, etc.). The first insulating material may have a cut-out section such that a portion of the first insulating material 954 may not overlap areas of the flexible PCBA 900' corresponding to an electrical circuit and/or a connector. In some cases, the second insulating material 952 may be a flexible material, a semi-flexible material electrically insulating material that may be bent around an edge of the flexible PCBA 900 or 900' such that at least an edge or another portion of the second insulating material is adjacent an opposite side of the flexible PCBA 900. The first insulating material 954 may be the same material or a different material than the second insulating material 952.

Figure 10A:
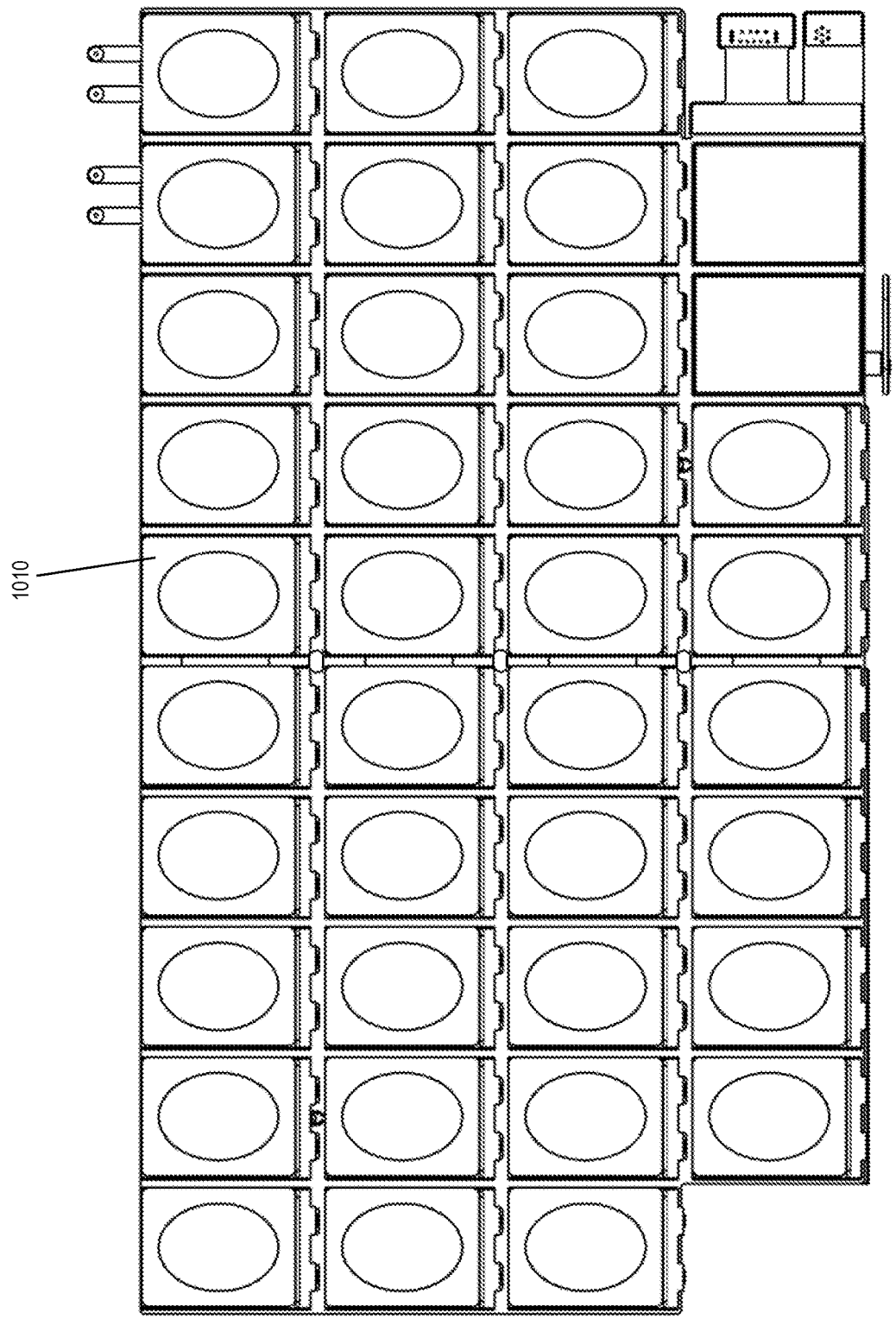
FIGS. 10A and 10B show second views of the flexible printed circuit board assembly before folding along the center line according to aspects of the present disclosure.
Figure 10B:
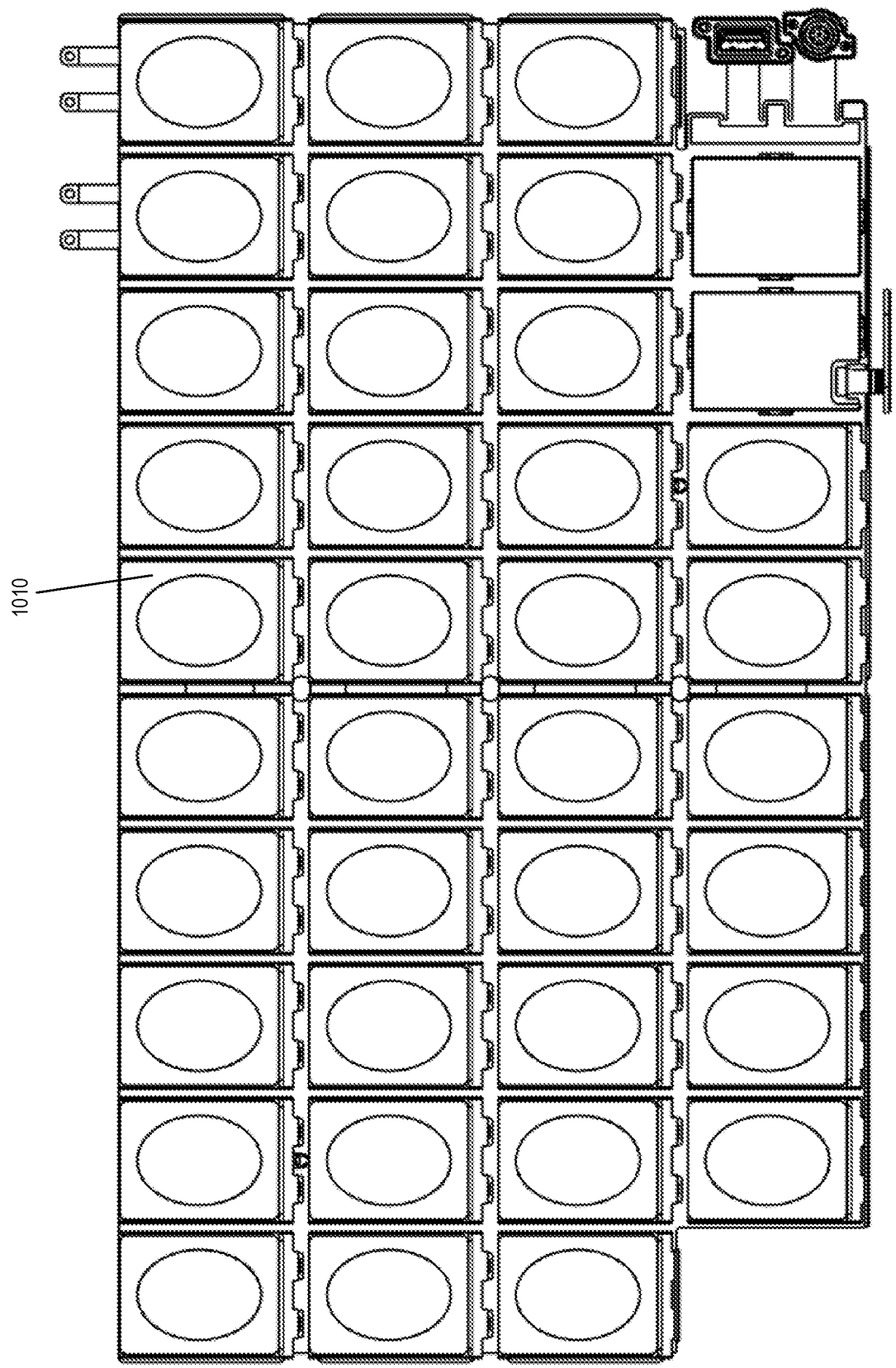
Figure 11:
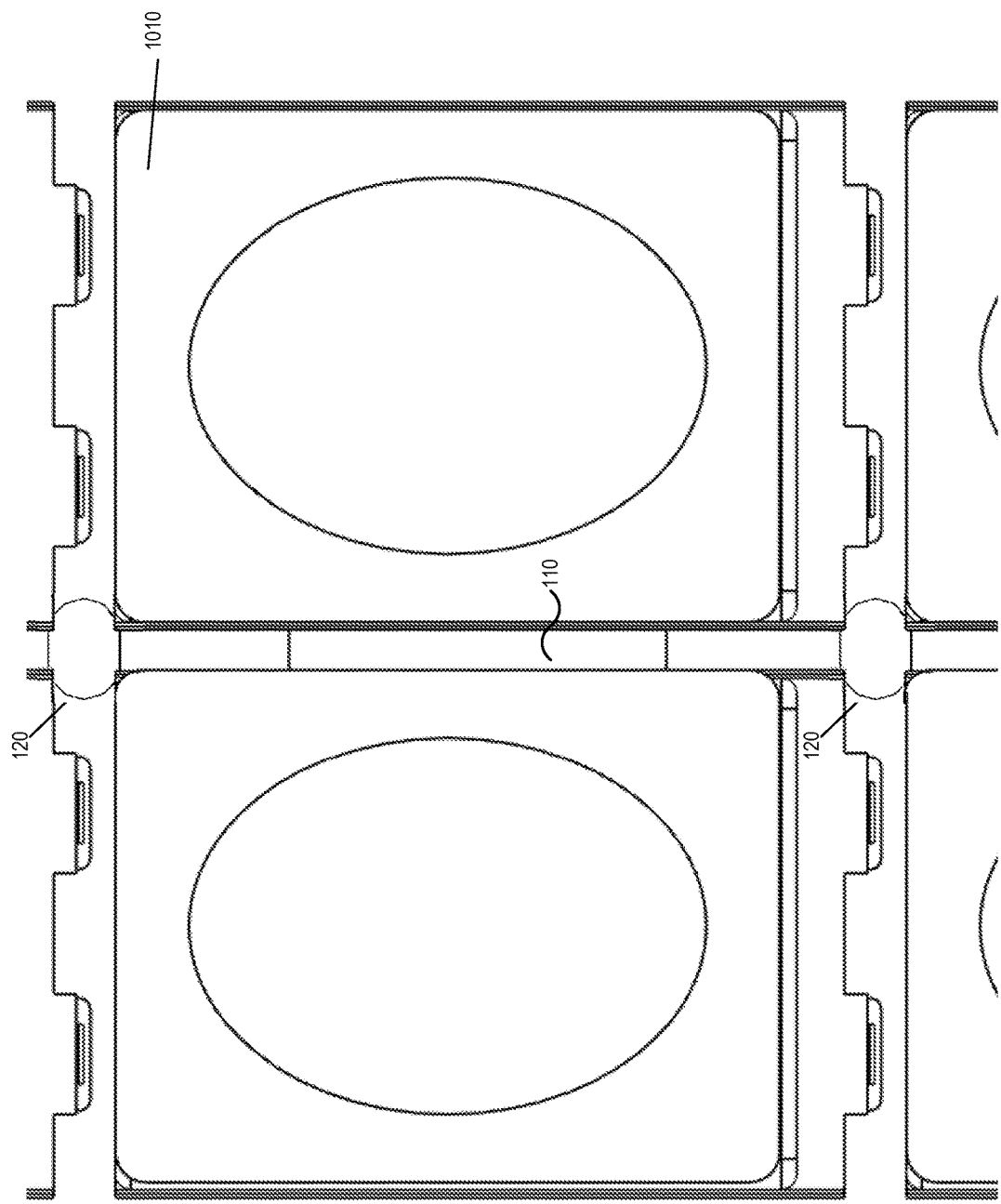
FIG. 11 shows a partial first view of the flexible printed circuit board assembly according to aspects of the present disclosure.
Figure 12:
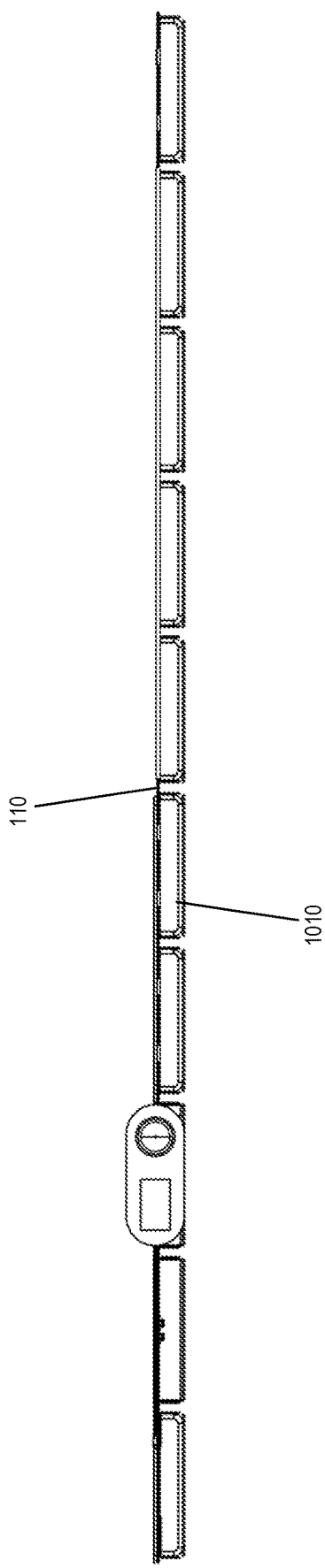
FIG. 12 shows a side view of the flexible printed circuit board assembly before folding along the center line according to aspects of the disclosure.
Figure 13:
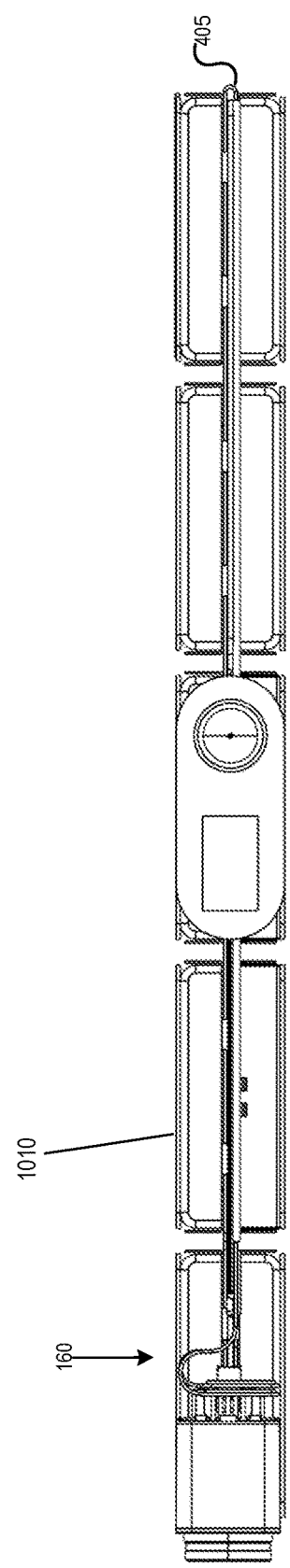
FIG. 13 shows a side view of the flexible printed circuit board assembly after folding along the center line according to aspects of the disclosure.
Figure 14A:
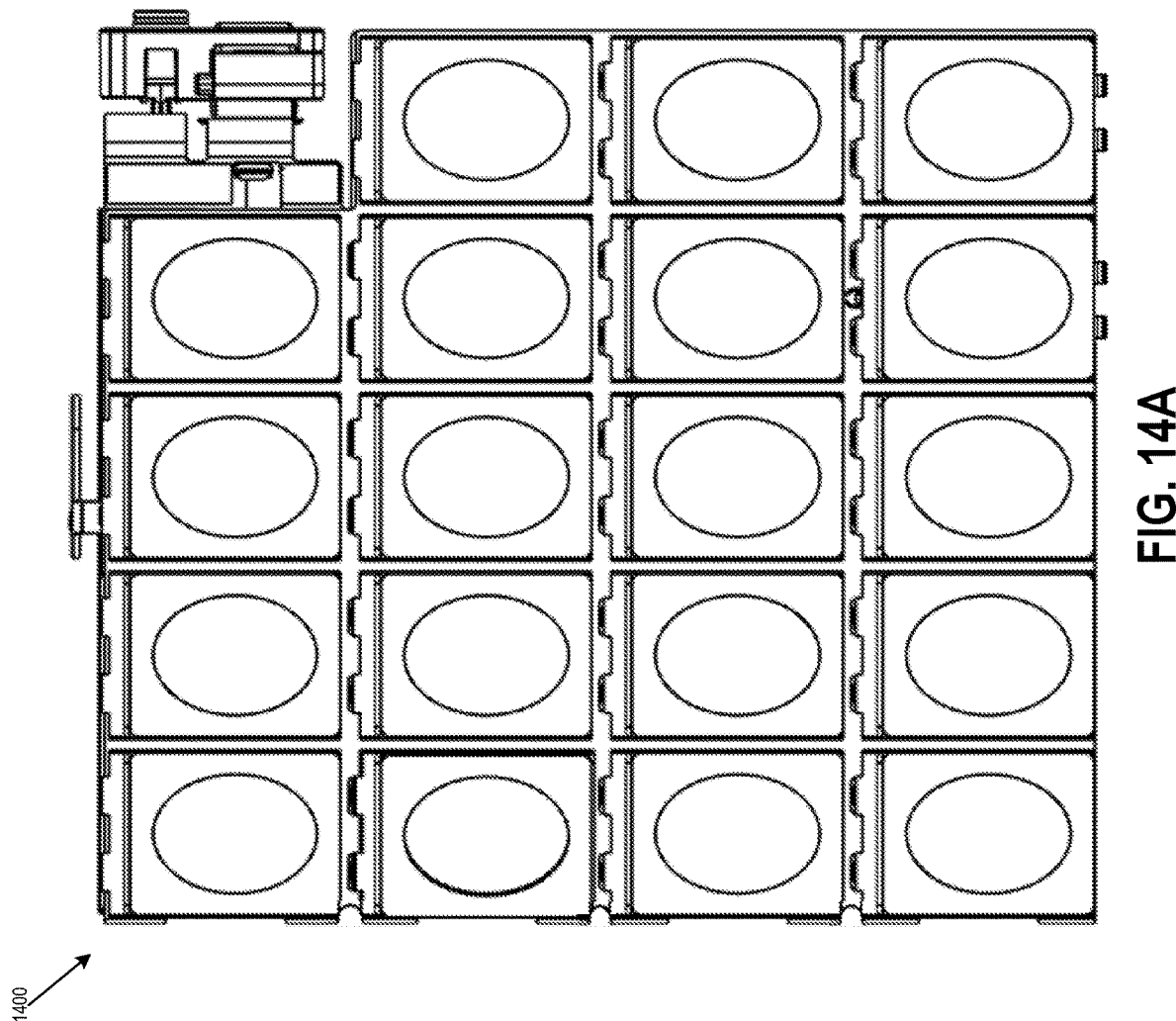
FIGS. 14A and 14B show first views of the flexible printed circuit board assembly after folding along the center line according to aspects of the disclosure.
Figure 14B:
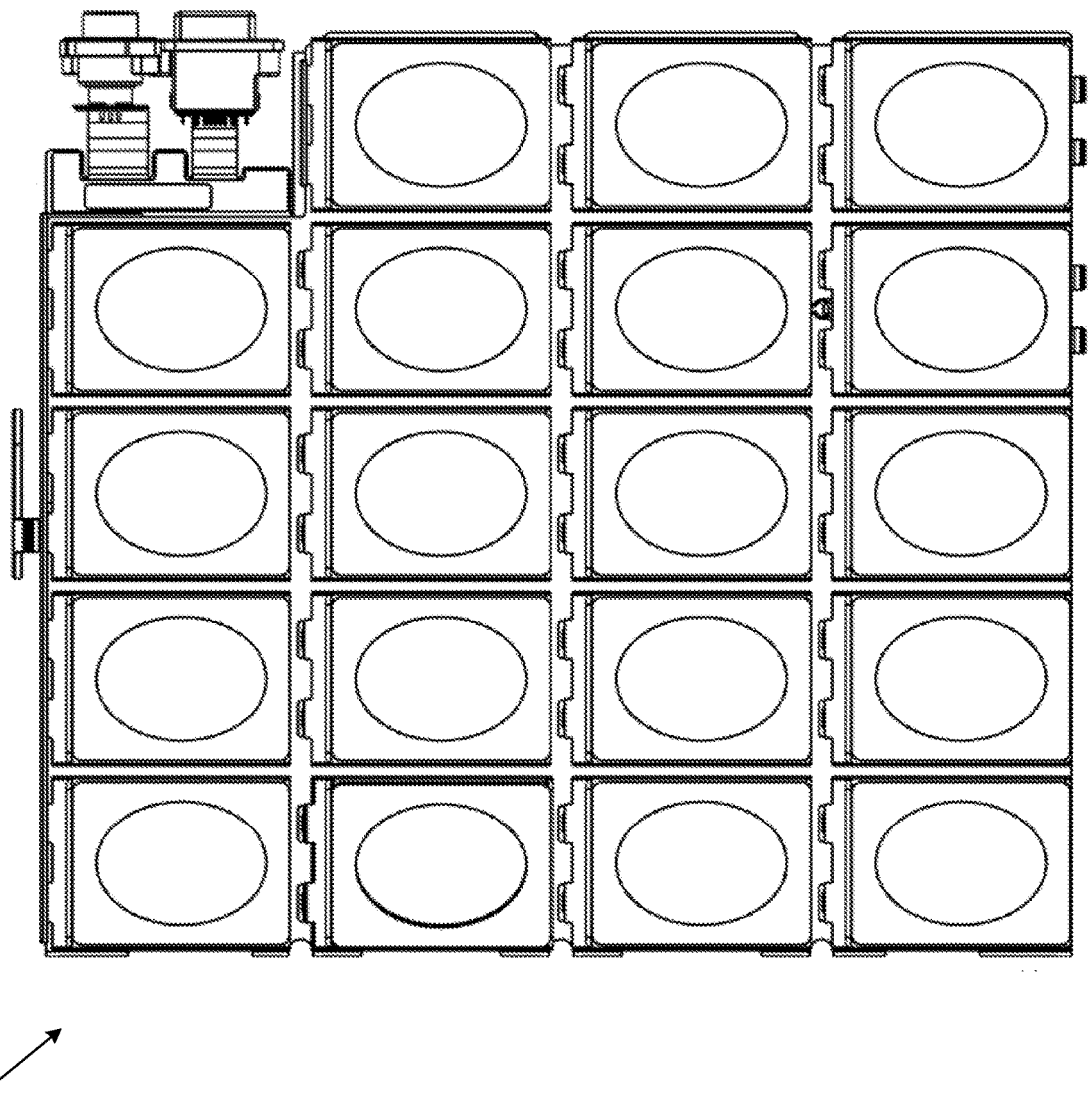

FIGS. 10A and 10B show second views of the flexible printed circuit board assembly 900, 900' before folding along the bend line according to aspects of the present disclosure. Here an array of battery cells 1010 may be physically and electrically attached to the flexible PCBA 900 and flexible PCBA 900'. FIG. 11 shows a partial first view of the flexible printed circuit board assembly showing the location of the cut-out 110 and the cut-out 120 with respect to battery cell modules 1010, when installed. FIG. 12 shows a side view of the flexible PCBA 900 before folding along the bend line according to aspects of the disclosure and FIG. 13 shows a side view of the flexible PCBA 900 after folding along the center line according to aspects of the disclosure. FIGS. 14A and 14B show first views of the flexible printed circuit board assembly 1400 and 1450 after folding along the bend line according to aspects of the disclosure.

FIG. 15 shows a partial side view of the flexible PCBA 900' after folding along the bend line and FIG. 16 shows a partial first view of the flexible PCBA 900' after folding along the bend line according to aspects of the disclosure.

Figure 17:
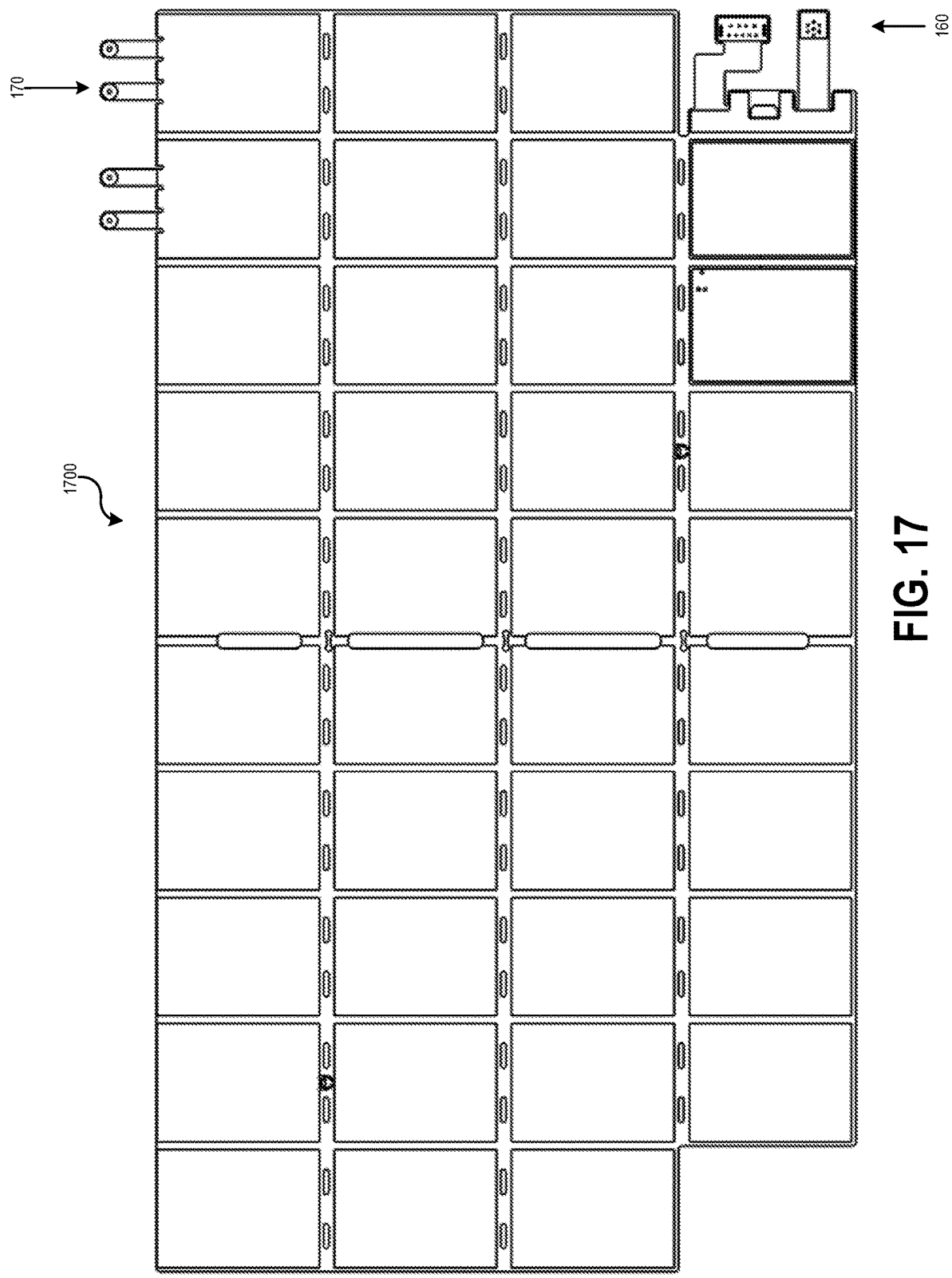
FIG. 17 shows a view of another flexible printed circuit board for an illustrative conformal wearable battery system according to aspects of the present disclosure.
Figure 18B:
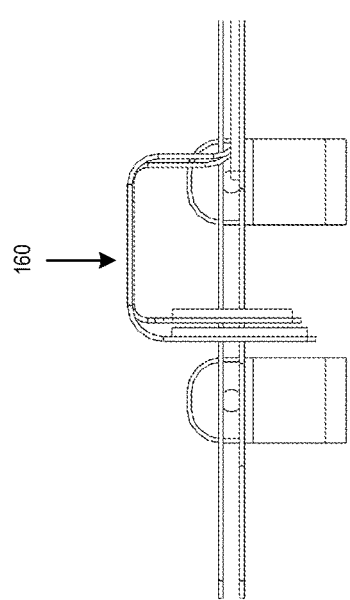
FIGS. 18B and 18C show a view of illustrative flexible connector portions of the flexible printed circuit board of FIG. 17 according to aspects of the disclosure.
Figure 18C:
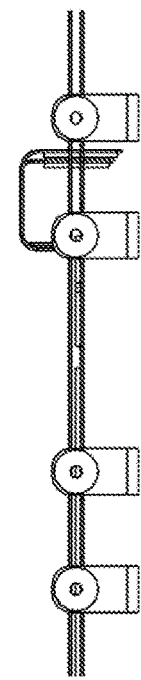
Figure 18A:
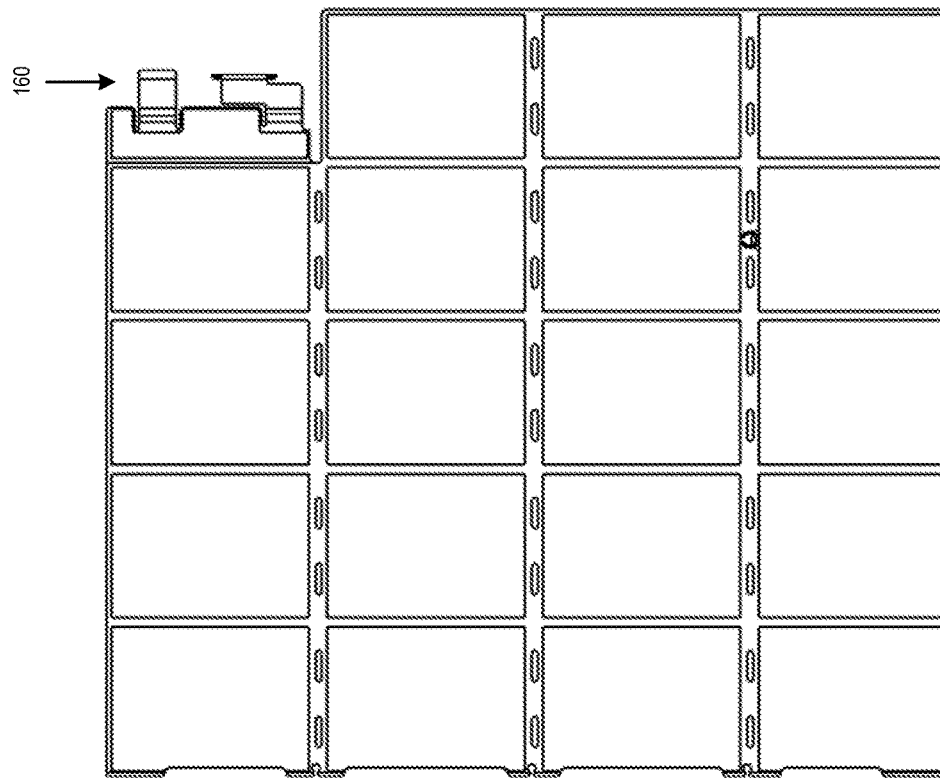
FIG. 18A shows a folded configuration of the flexible printed circuit board of FIG. 17 according to aspects of the disclosure.

FIG. 17 shows a view of another flexible printed circuit board 1700 for an illustrative conformal wearable battery system according to aspects of the present disclosure, where the configuration of the flexible PCB 1700 is similar to that of the flexible PCB 100, where differences are primarily noted in a configuration of the charging connection portion 180 and the flexible connector portion 160. FIG. 18A shows a folded configuration of the flexible printed circuit board of FIG. 17 according to aspects of the present disclosure. FIG. 18B shows a view of the illustrative flexible connection portion 160 in a folded configuration and FIG. 18C shows a view of the illustrative charging connection portion 180 of the flexible printed circuit board 1700 according to aspects of the present disclosure.

Figure 18D:
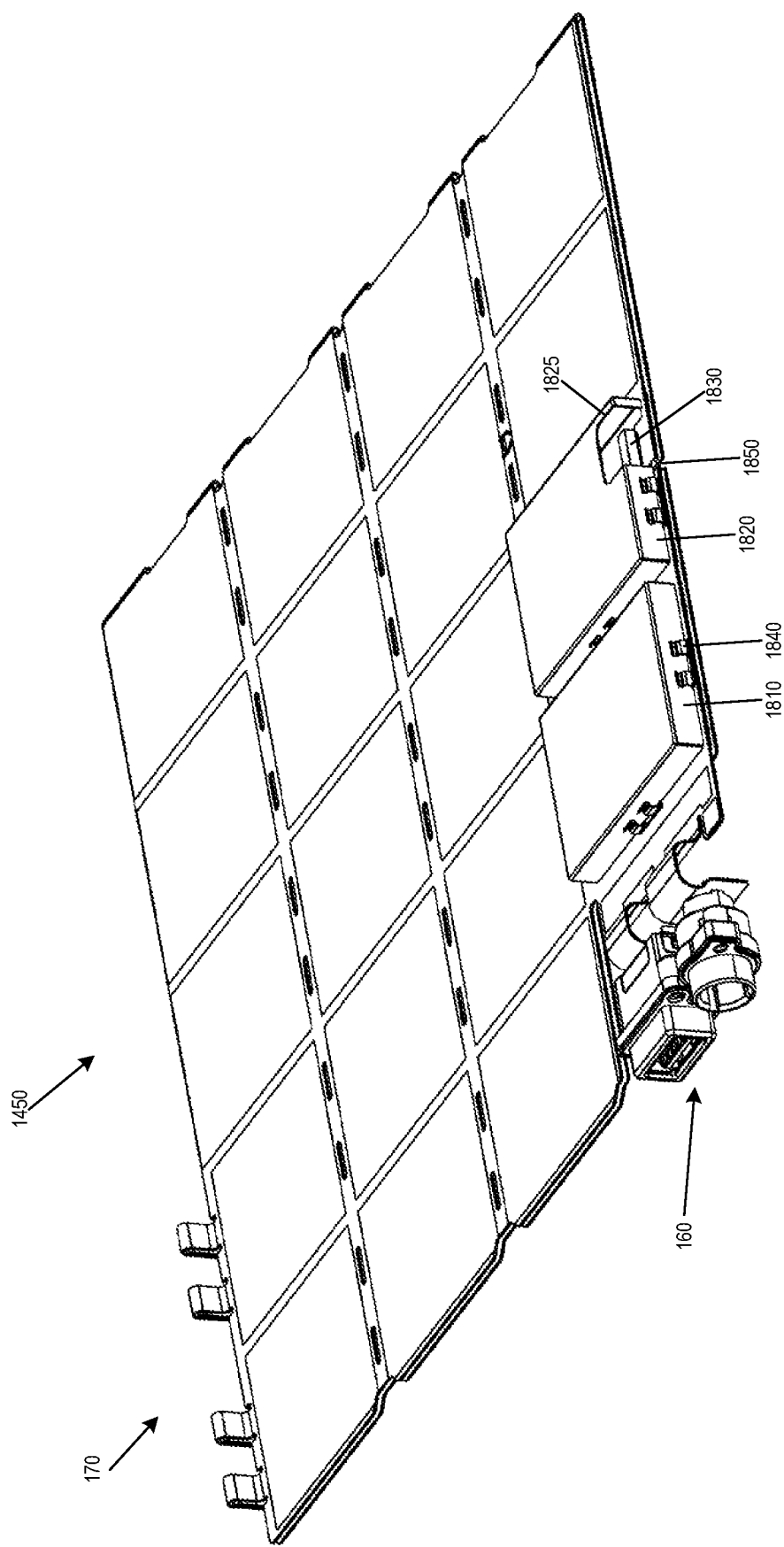
FIG. 18D shows a view of the illustrative flexible printed circuit board of FIG. 14B according to aspects of the disclosure.

The flexible PCB 100 with the rectangular and/or circular cuts may allow for an improved manufacturable bend along the bend axis 105. In addition, the flexible PCB 100 allows for an improved configuration for the connection of a plurality of cells (e.g., 36 cells) in as flat a pattern as possible and within a minimized area, while maintaining flexibility. Generally, printed circuit boards such as the flexible PCB 100 are not useful for other battery packs, particularly if the other battery pack does not have to be flexible. A main advantage to the disclosed flexible PCB 100 is that the flexible PCB 100 allows for easy connection of each cell, both physically and electrically to the flexible PCB 100, while allowing a finished product incorporating the flexible PCB 100 (e.g., a conformal wearable battery) to meet or exceed flexibility requirements defined for the conformal wearable battery. FIG. 18D shows a view of the illustrative flexible printed circuit board of FIG. 14B according to aspects of the disclosure. The flexible printed circuit board assembly 1450 may include one or more circuit protection components (e.g., circuit enclosure 1810, circuit enclosure 1820) that may be used to enclose electrical circuit components of the CWB. The circuit enclosure 1810 and the circuit enclosure 1820 may be constructed of a rigid or semi-rigid material capable of providing mechanical protection to the electrical circuit components. Additionally, the circuit enclosure 1810 and/or the circuit enclosure 1820 may be constructed of an electrically conductive material (e.g. aluminum, steel, copper, a conductive polymeric material, a foil covered plastic, etc.) that may provide electromagnetic interference (EMI) protection for the CWB. Each of the circuit enclosure 1810 and/or the circuit enclosure 1820 may be physically and/or electrically connected to the flexible PCBA 1450. For example, one or more clips may be used to mechanically attach one or both of the circuit enclosure 1810, 1820 to the flexible PCBA 1450. In some cases, one or more or the clips may be an EMI clip 1840 made of a conductive material that may additionally facilitate an electrical connection between the circuit enclosure 1810, 1820 to an electrical ground (e.g., a ground plane) of the flexible PCBA 1450. In some cases, at least one EMI clip 1840 may be positioned on each side of the connected circuit enclosure 1810, 1820. In some cases, a circuit enclosure (e.g., circuit enclosure 1820) may include a cut-out portion 1830 to facilitate an electrical connection from an electrical connector 1830 on the flexible PCBA 1450 to an additional component of the CWB, such as an input/output module (e.g., a display module) capable of providing status information from a controller of the CWB to a user of the CWB. In some cases, the circuit enclosure 1810, 1820 may be of a similar size and/or shape (e.g., similar dimensions) to that of a battery cell.

Figure 19A:
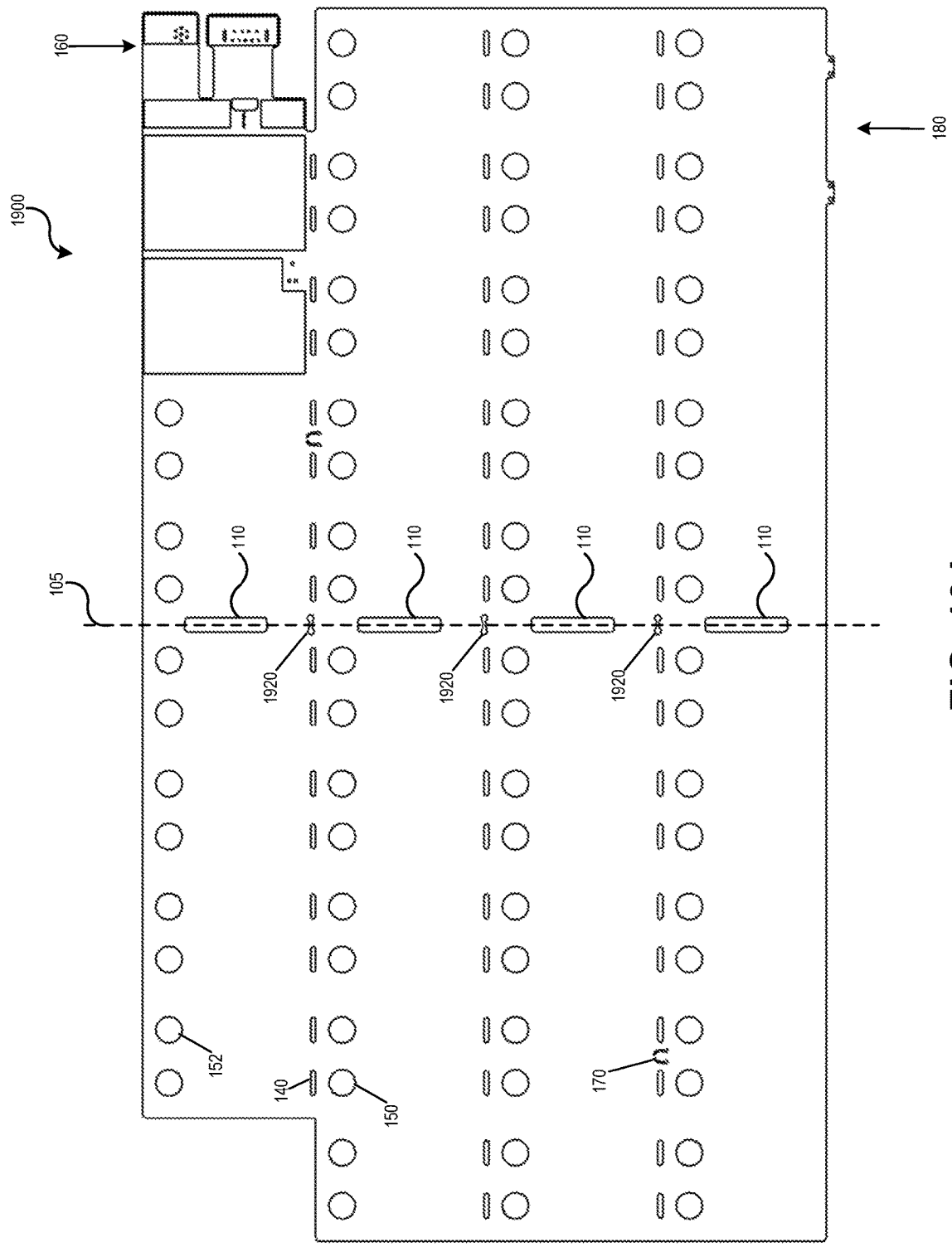
FIGS. 19A-D show illustrative views of a second design of an illustrative flexible printed circuit board assembly according to aspects of the disclosure.

FIGS. 19A-19D show illustrative views of an illustrative flexible PCB 1900 according to aspects of the disclosure. FIG. 19A shows a first view of an illustrative flexible printed circuit board (PCB) 1900 for an illustrative conformal wearable battery system according to aspects of the present disclosure. The flexible PCB 1900 may be configured to provide power and/or electrical signals from a plurality of battery cells and/or other components of a CWB. The flexible PCB 1900 may be formed of one or more layers of a flexible polymer or plastic material, such as a polyimide or other such flexible substrate. In some cases, markings showing locations of placement of battery cells may be formed on a surface of the flexible PCB, such as through a silk-screening process, or other like method. Electrical conductors may be included in one or more layers of the flexible PCBA. In some cases, no markings showing battery placement may be present. In some cases, electrical conductors may be configured as a conductive pattern (e.g., a copper overlay, a conductive ink, etc.) on the surface of the substrate of the flexible PCB 1900. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an Electroless nickel immersion gold (ENIG) finish, a lead-free immersion silver finish or other substances with improved conductive properties.

The flexible PCB 1900 may be configured to bend along a bend line 105 located at or near a center line of the flexible PCB 1900. One or more elongated cut-outs may be disposed parallel to the bend line 105 (e.g., cut-out 110) and/or perpendicular to the bend line 105 (e.g., cut-out 1920). Such cut-outs may provide additional flexibility to the flexible PCB 1900 to allow for easier formation of a 180-degree bend such as by folding the right half of the flexible PCB 1900 over the left half of the flexible PCB 1900. In the illustrative example, relief cuts, such as the cut-out 110 may be formed as a rounded elongated rectangular cutout and the cut-out 1920, may be formed in a "dog bone" shape (e.g., two substantially circular sections connected by a rectangular section). As mentioned, the elongated rounded rectangular cut-outs (e.g., cut-out 110) parallel to the bend line 105 may reduce stress on the plastic substrate when forming the about 180-degree bend. Additionally, the dog bone-shaped cut-outs (e.g., cut-out 1920) may reduce stresses placed on the flexible PCB substrate during use, such as by reducing stresses along a line of deformation between battery cells. By reducing the bending stress at locations along the bend line, a probability of a catastrophic failure of the substrate (e.g., cracking, delamination, and the like) is reduced. While cut-out 110 is shown as a rounded rectangular shape and the cut-out 1920 is shown as a dog bone shape, other shapes may be used to reduce stress due to bending and/or flexing of the flexible PCB 1900. While a dog bone shape is shown on the illustrative example, other cut shapes may be used to achieve a same or similar purpose. Such other shapes may include circular cuts which may be used, for example, for removing more weight, ovular cuts which may provide additional stress relief, for example, based on the curves, elongated slots, which, for example, may be similar to the rectangular cuts but with even more filet on corners to reduce additional stresses, or the like.

The flexible PCB 1900 may also include a plurality of solder pads (e.g., pads 150) to provide electrical connection for the cathode and anode of each battery module. For battery cells located near an edge of the flexible PCB 1900, the cathode an anode connectors may be bent over the edge of the flexible PCB 1900. For battery cells located away from the edge of the flexible PCB, a plurality of cut-outs (e.g., cut-out 140) are located near a corresponding pad 150 to allow for solder or weld connection of the battery cathode or anode connector to the flexible PCB 1900. Additionally, the flexible PCB 1900 may include charging connection portion 170 that may be used to connect to one or more charging tabs on an exterior portion of a case of the conformal wearable battery enclosure and/or a flexible connector portion 160 that may include one or more flexible connectors to connect to additional circuitry, such as a control module, a display module, or the like). The flexible PCB 1900 may also include one or more semi-circular cut-out sections to provide an area of low mechanical stress at an interior portion of the flexible PCB 1900. In some cases, an electrical component 280, shown in FIG. 2, (e.g., a thermistor) may be physically connected to the flexible PCB 1900 in this area such that the electrical component does not receive stress loads while the CWB is flexed during use. Such stress loads, without the stress relief provided by the semi-circular cut-outs, may cause the electrical component to detach from the flexible PCB 1900.

Figure 19B:
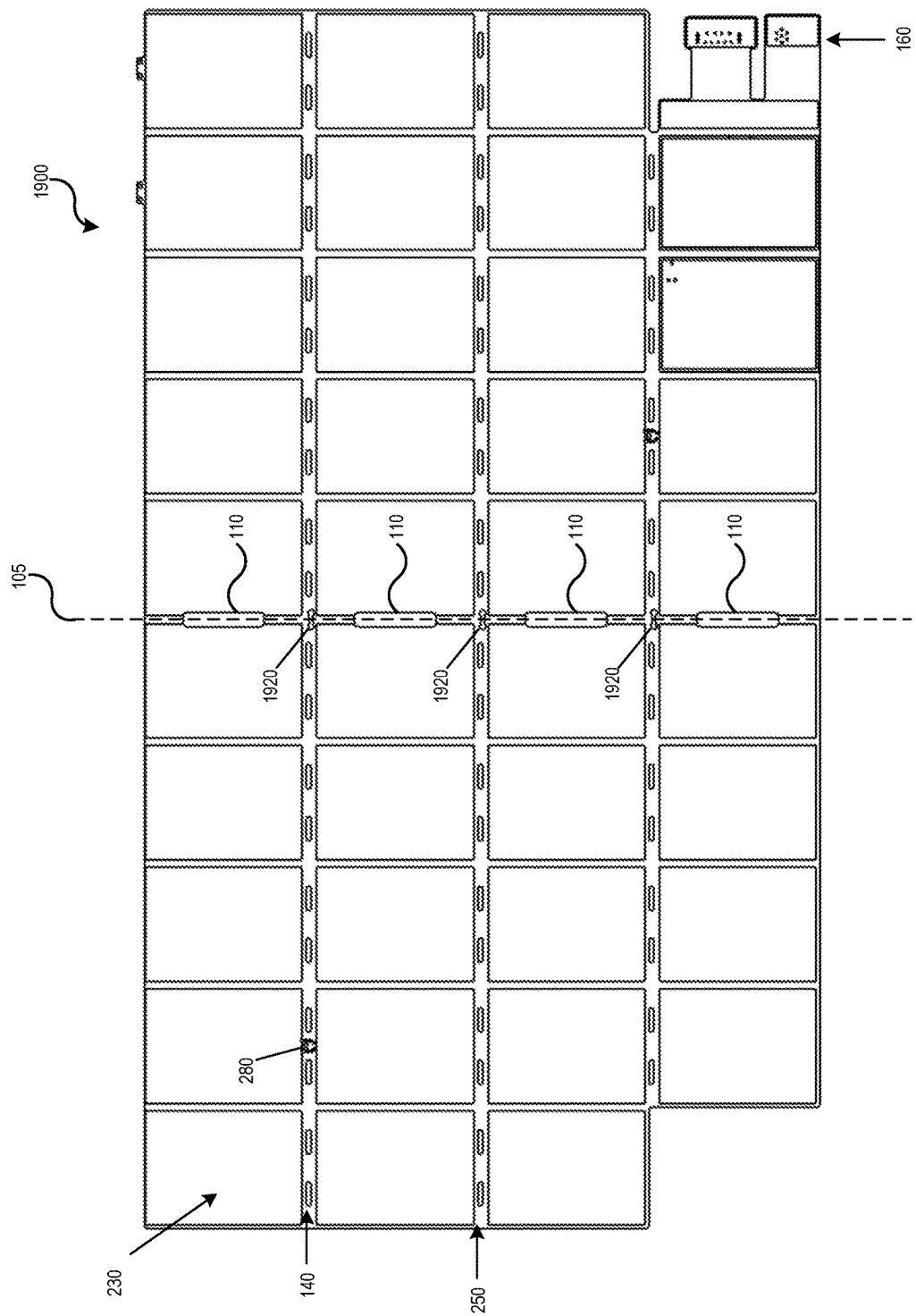

FIG. 19B shows second view of the illustrative flexible printed circuit board 1900 for the illustrative conformal wearable battery system according to aspects of the present disclosure. In some cases, connection locations for each battery cell may be marked and/or may include a rigidizing material, or may be otherwise reinforced. Each battery cell location 230 may be associated with a pair of cut-outs for the anode and cathode connections, as discussed above. Here, a battery cell module may be physically attached to the substrate of the flexible PCB 1900, such as by use of an adhesive material (e.g., glue, tape, etc.). The cathode and anode connection tabs may be inserted through a corresponding cut-out 140 so that the connection tabs may be soldered, welded, or otherwise connected to the connection pad 150 on the other side of the flexible PCB 1900.

The electrical connection cut-outs (e.g., cut-out 140) may be disposed near a flex line 250 between rows of battery cell locations 230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 250 allow for the CWB to be flexed within a designed range of motion, when in use. To provide stress relief along these flex lines between the rigid battery cell portions, the dog bone-shaped cut-outs 1920 are disposed within each flex line 250 and may be aligned with a portion of the battery cell connection cut-outs (e.g., cut-out 140).

Figure 19C:
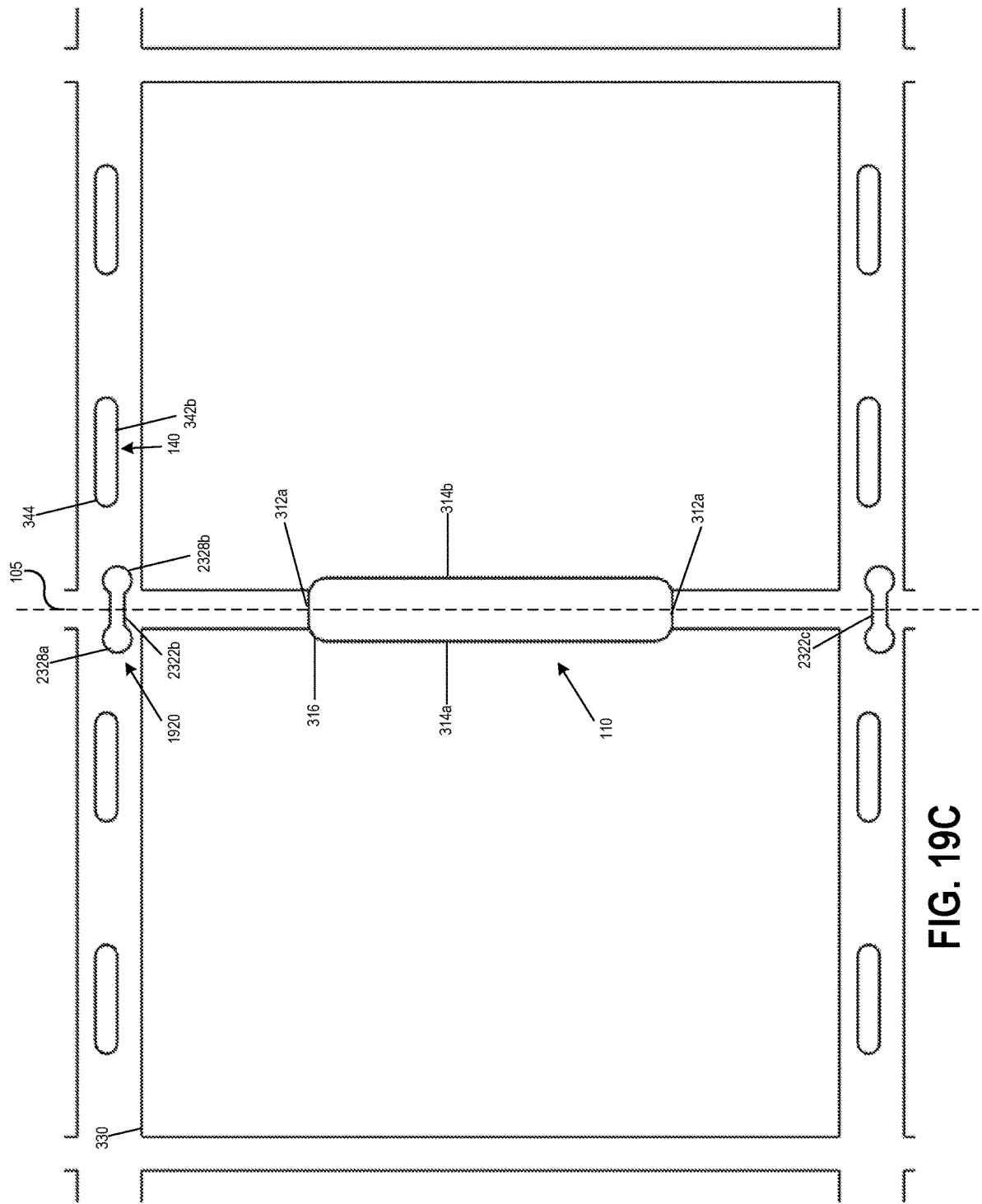

FIG. 19C shows a partial second view of the illustrative flexible printed circuit board 1900 including cut-outs providing strain relief along a center line according to aspects of the present disclosure. As discussed above, the rectangular cut-out 110 may be disposed centered on and parallel to the bend line 105 at the center of the flexible PCB 1900, where at least a portion of the cut-out 110 may be disposed underneath a battery cell module when installed. In an illustrative example, a battery cell connection area 330 may be about 50 mm in length, where the cut-out 110 may be located near a mid-point of the battery cell connection area 330. In an illustrative example, a first edge 312a of the cut-out 110 may be located at a first distance (e.g., about 11.5 mm) from a first edge of the battery cell connection area 330, the second edge 312b of the cut-out 110 may be located at a second distance (e.g., about 11.5 mm) from the second edge of the battery cell connection area 330, and the length of the cut-out 110 between the first edge 312a and the second edge 312b may be a first dimension (e.g., about 25 mm). In some cases, locations and/or sizes of cut-outs may differ between locations on the flexible PCB. A width of the cut-out between the left edge 314a and the right edge 314b may be a second dimension (e.g., about 4.5 mm), and a radius of each rounded corner 316 may be a third dimension (e.g., about 1.1 mm). The specific distances and/or dimension are given for illustrative purposes and other distances and/or dimensions may be contemplated within the scope of this disclosure.

The illustrative dog bone-shaped cut-out 1920 may be formed as a rectangular area 2322b connecting two circular areas 2328a and 2328b. For example, the dog bone-shaped connector 1920 may be centered on and perpendicular to the bend line 105. The rectangular area 2322b may be about 1 mm high and about 2.25 mm wide. Each circular area 2328a and 2328b may have a radius of about 2 mm.

The illustrative battery connection cut-out 140 may be formed as an elongated oval shape of about 1.5 mm high and having a distance of about 6 mm between a center point of each circular end portion (e.g., 344) and an overall length of about 9 mm. In some cases, a second edge 342b of the cut-out 140 may align with a center line through the dog bone-shaped cut-out 1920. Additionally, the dog bone-shaped cut-out 1920 may be located about 4.8 mm from the battery connection cut-out 140.

Figure 19D:
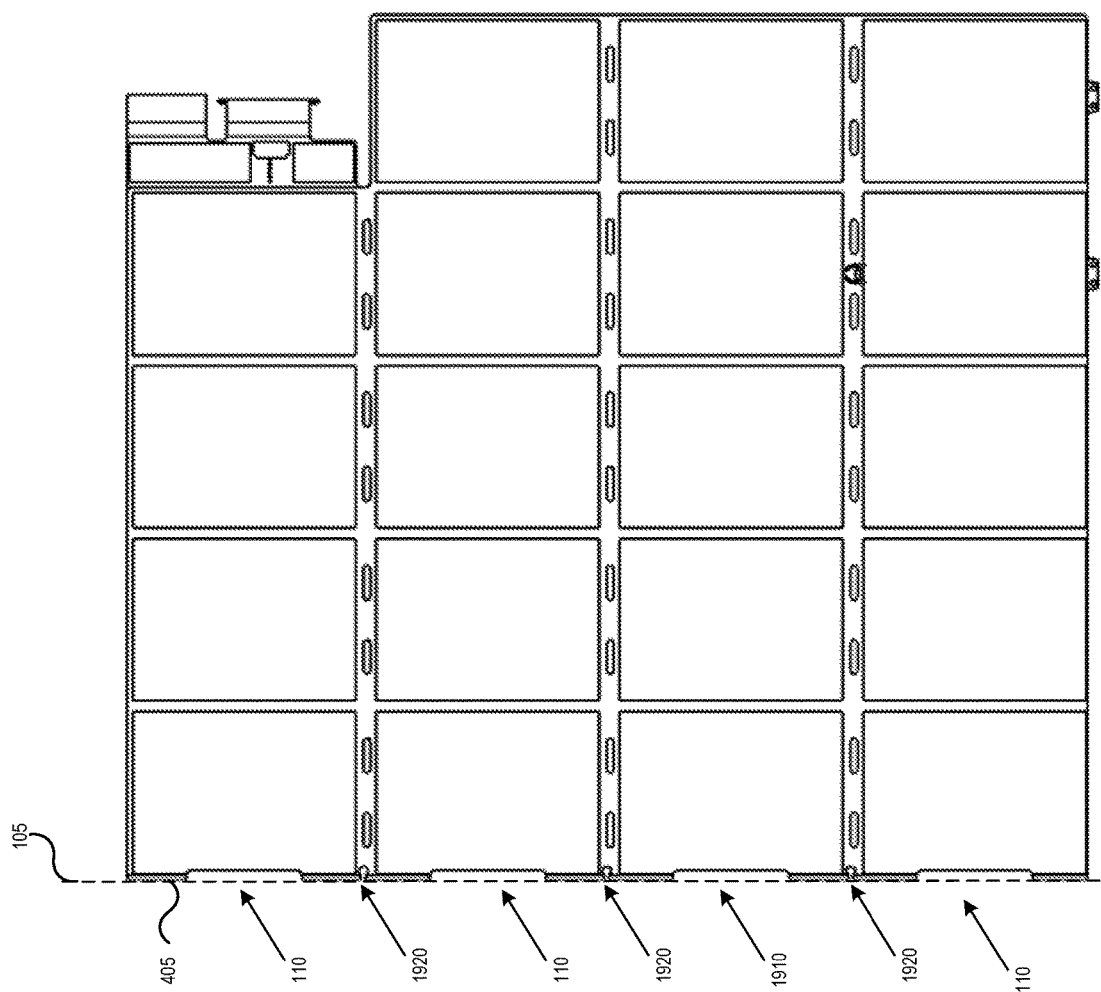

FIG. 19D shows a first view of the illustrative flexible printed circuit board 1900 folded along the bend line 105 according to aspects of the present disclosure. For example, a 180-degree bend 405 may be formed along the bend line 105, such as when a left half of the flexible printed circuit board 1900 is folded over a right half of the flexible printed circuit board 1900 such that the battery modules are located on the exterior portion of the folded flexible printed circuit board 1900 and the electrical connections for the battery modules are disposed on an interior portion of the folded flexible printed circuit board 1900.

While aspects of the disclosure have been described with reference to battery cells and/or a CWB comprising battery cells, arrangements and methods as described herein may also be applied to other devices and systems having a flexible PCBA to maximize space within a housing. For example, the arrangements and methods described herein may apply to any electronic device disposed within a housing for which maximizing usable interior space within a housing by folding a flexible PCBA within the available interior space is desired. Examples of such electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, computing processors, solar cell based power generation devices, wave motion based power generation devices, fuel cell based power generation devices, battery charging controllers, and/or portable chemical batteries for powering electronic or electrical devices.

In an illustrative example, a conformal wearable battery may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

The conformal wearable battery of the illustrative example may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery of the illustrative example, may include a bend axis where the bend axis comprises a center portion of the grid like pattern of the physical connection sections.

The conformal wearable battery of the illustrative example, may include the plurality of cut-outs where each first cut-out of the plurality of first cut-outs is rectangular-shaped, and where a longer edge of each first cut-out is disposed parallel to the bend axis.

The conformal wearable battery of the illustrative example, where each corner of each first cut-out of the plurality of first cut-outs is rounded.

The conformal wearable battery of the illustrative example, where each second cut-out of the plurality of second cut-outs comprises a first semi-circular section, a second semi-circular section and a rectangular section.

The conformal wearable battery of the illustrative example, where the rectangular section is disposed between the first semi-circular section and the second semi-circular section.

The conformal wearable battery of the illustrative example, where the rectangular section is disposed laterally across the bend axis, wherein a mid-point of the rectangular section is located near the bend axis.

The conformal wearable battery of the illustrative example, where each of the plurality of battery cells is physically attached to a first side of the flexible PCBA.

The conformal wearable battery of the illustrative example, where the plurality of battery cells is disposed on an outside surface of the flexible PCBA, when the flexible PCBA is in a folded configuration.

The conformal wearable battery of the illustrative example may further include a sealed flexible housing wherein the flexible PCBA is disposed within an interior cavity of the sealed flexible housing and wherein the flexible PCBA is in a folded configuration.

A second illustrative example of a system may include a plurality of battery cell modules and a flexible printed circuit board assembly (PCBA). The flexible PCBA includes a plurality of battery cell connection sections disposed in a grid-like pattern along a first surface of the flexible PCBA, a bend axis configured to divide the flexible PCBA in half when the flexible PCBA is in a folded configuration, and a plurality of cut-outs disposed along the bend axis, wherein each of the plurality of cut-outs reduce a bending force placed on the flexible PCBA when a flexing force is applied to the flexible PCBA.

The system of the second illustrative example, where the plurality of cut-outs comprises a plurality of first cut-outs having a first shape, and a second plurality of cut-outs having a second shape.

The system of the second illustrative example, where the first shape comprises a substantially rectangular shape having rounded corners.

The system of the second illustrative example, where the second shape comprises at least one semi-circular section and a rectangular section.

The system of the second illustrative example, where the second shape comprises a rectangular section disposed across the bend axis and a first semi-circular section disposed at an end of the rectangular section on a first side of the bend axis and a second semi-circular section disposed at an opposite end of the rectangular section and on an opposite side of the bend axis.

The system of the second illustrative example, where a first plurality of cut-outs of the plurality of cut-outs are located near an approximate mid-point of a battery cell module.

The system of the second illustrative example, where a portion of the plurality of cut-outs is disposed on a bend line that is perpendicular to the bend axis and between two adjacent battery cell modules A third illustrative example may include a flexible printed circuit board assembly (PCBA) comprising a plurality of battery modules physically affixed to the flexible PCBA, wherein the plurality of battery modules are arranged in a grid-like pattern, a bend axis near an approximate mid-point of the flexible PCBA, wherein bending the flexible PCBA along the bend axis folds the flexible PCBA in half, and a plurality of cut-outs disposed along the bend axis, wherein the cutouts reduce a force exerted on the flexible PCBA along the bend axis when the flexible circuit board is flexed.

The flexible PCBA of the third illustrative example, where the plurality of cut-outs disposed along the bend axis comprise a plurality of first cut-outs having a first shape and a plurality of second cut-outs having a second shape and wherein the plurality of first cut-outs are disposed along a flexible portion of the flexible PCBA between adjacent rows of the grid-like pattern that are perpendicular to the bend axis and the plurality of second cut-outs are disposed between adjacent battery modules in columns of the grid-like pattern, wherein the columns are on opposite sides of the bend axis.

Aspects of the disclosure have been described in terms of illustrative examples thereof. Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A conformal wearable battery comprising:
   a plurality of battery cells; and
   a flexible printed circuit board assembly (PCBA) comprising:
      a plurality of physical connection sections disposed in a grid like pattern, wherein each battery cell of the plurality of battery cells is physically affixed to the flexible PCBA at a corresponding physical connection section of the plurality of physical connection sections;
      a bend axis disposed between two parallel physical connection sections, wherein the bend axis facilitates folding of the flexible PCBA in half;
      a plurality of first cut-outs disposed along the bend axis, wherein a longer edge of each first cut-out of the plurality of first cut-outs is disposed parallel to the bend axis;
      a plurality of second cut-outs disposed across the bend axis, wherein a longer edge of each second cut-out of the plurality of second cut-outs is disposed perpendicular to the bend axis; and
      a plurality of third cut-outs disposed in pairs along a flex line perpendicular to the bend axis, wherein each pair of the third cut-outs facilitate an electrical connection, to the flexible PCBA, from a battery cell of the plurality of battery cells.

2. The conformal wearable battery of claim 1, wherein the flexible PCBA comprises a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

3. The conformal wearable battery of claim 1, wherein the bend axis comprises a center of the grid like pattern of the physical connection sections.

4. The conformal wearable battery of claim 1, wherein each first cut-out of the plurality of first cut-outs is substantially rectangular-shaped.

5. The conformal wearable battery of claim 1, wherein each corner of each first cut-out of the plurality of first cut-outs is rounded.

6. The conformal wearable battery of claim 1, wherein each second cut-out of the plurality of second cut-outs comprises a first semi-circular section, a second semi-circular section and a rectangular section.

7. The conformal wearable battery of claim 6, wherein the rectangular section is disposed between the first semi-circular section and the second semi-circular section.

8. The conformal wearable battery of claim 6, wherein the rectangular section is disposed laterally across the bend axis, wherein a mid-point of the rectangular section is located near the bend axis.

9. The conformal wearable battery of claim 1, wherein each of the plurality of battery cells is physically attached to a first side of the flexible PCBA.

10. The conformal wearable battery of claim 1, wherein the plurality of battery cells are disposed on an outside surface of the flexible PCBA, when the flexible PCBA is in a folded configuration.

11. The conformal wearable battery of claim 1, further comprising a sealed flexible housing wherein the flexible PCBA is disposed within an interior cavity of the sealed flexible housing and wherein the flexible PCBA is in a folded configuration.

12. A system comprising:
a plurality of battery cell modules;
a flexible printed circuit board assembly (PCBA) comprising:
a plurality of battery cell connection sections disposed in a grid-like pattern along a first surface of the flexible PCBA;
a bend axis configured to divide the flexible PCBA in half when the flexible PCBA is in a folded configuration;
a plurality of first cut-outs disposed along the bend axis, wherein each of the plurality of first cut-outs reduce a bending force placed on the flexible PCBA when a flexing force is applied to the flexible PCBA; and
a plurality of second cut-outs disposed in pairs along a first flex line perpendicular to the bend axis and between adjacent battery cell modules, wherein each pair of the second cut-outs facilitate an electrical connection, to the flexible PCBA, from a battery cell module of the plurality of battery cell modules.

13. The system of claim 12, wherein the plurality of first cut-outs comprises:
a plurality of third cut-outs having a first shape; and
a fourth plurality of cut-outs having a second shape.

14. The system of claim 13, wherein the first shape comprises a substantially rectangular shape having rounded corners.

15. The system of claim 13, wherein the second shape comprises at least one semi-circular section and a rectangular section.

16. The system of claim 13, wherein the second shape comprises a rectangular section disposed across the bend axis and a first semi-circular section disposed at an end of the rectangular section on a first side of the bend axis and a second semi-circular section disposed at an opposite end of the rectangular section and on an opposite side of the bend axis.

17. The system of claim 12, wherein a first cut-out of the first plurality of cut-outs are is located near an approximate mid-point of a battery cell module and between the first flex line and a second flex line.

18. The system of claim 12, wherein a second cut-out of the first plurality of cut-outs is disposed on the first flex line.

19. A flexible printed circuit board assembly (PCBA) comprising:
a plurality of battery modules physically affixed to the flexible PCBA, wherein the plurality of battery modules are arranged in a grid-like pattern;
a bend axis is near an approximate mid-point of the flexible PCBA, wherein bending the flexible PCBA along the bend axis results in a folded configuration of the flexible PCBA;
a plurality of first cut-outs disposed in pairs along a flex line perpendicular to the bend axis, wherein each pair of the first cut-outs facilitate an electrical connection, to the flexible PCBA, from a battery module of the plurality of battery modules; and
a plurality of second cut-outs disposed along the bend axis, wherein the plurality of second cut-outs reduce a force exerted on the flexible PCBA along the bend axis when the flexible PCBA is flexed.

20. The flexible PCBA of claim 19, wherein the plurality of second cut-outs disposed along the bend axis comprises a plurality of third cut-outs having a first shape and a plurality of fourth cut-outs having a second shape and wherein the plurality of third cut-outs are disposed parallel to a flexible portion of the flexible PCBA between adjacent rows of the grid-like pattern that and wherein a longer edge of the third cut-out of the plurality of third cutouts is perpendicular to the bend axis and the plurality of fourth cut-outs are disposed between adjacent battery modules arranged in columns of the grid-like pattern, wherein the columns are on opposite sides of the bend axis, and wherein a longer edge of the fourth cut-out is disposed parallel to the bend axis.

* * * * *

UNITED STATES PATENT AND TRADEMARK OFFICE
CERTIFICATE OF CORRECTION

| | | |
|---|---|---|
| PATENT NO. | : 11,064,604 B1 | Page 1 of 1 |
| APPLICATION NO. | : 17/038287 | |
| DATED | : July 13, 2021 | |
| INVENTOR(S) | : Goldin et al. | |

It is certified that error appears in the above-identified patent and that said Letters Patent is hereby corrected as shown below:

In the Claims

At Column 18, Claim number 17, Line number 2, delete "are".

At Column 18, Claim number 20, Line number 30, delete "that".

Signed and Sealed this
Twenty-sixth Day of April, 2022

Katherine Kelly Vidal
*Director of the United States Patent and Trademark Office*